(12) United States Patent  
Shimomura et al.

(10) Patent No.: US 7,989,316 B2  
(45) Date of Patent: *Aug. 2, 2011

(54) METHOD OF MANUFACTURING SEMICONDUCTOR DEVICE

(75) Inventors: Akihisa Shimomura, Isehara (JP); Tatsuya Mizoi, Atsugi (JP); Hidekazu Miyairi, Isehara (JP); Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/824,775

(22) Filed: Jun. 28, 2010

(65) Prior Publication Data

US 2010/0267216 A1   Oct. 21, 2010

Related U.S. Application Data

(63) Continuation of application No. 12/216,622, filed on Jul. 8, 2008, now Pat. No. 7,745,310.

(30) Foreign Application Priority Data

Jul. 9, 2007   (JP) ................................. 2007-179241

(51) Int. Cl.  
*H01L 21/30* (2006.01)
(52) U.S. Cl. ................. 438/458; 257/E21.568; 438/478
(58) Field of Classification Search .......... 438/455–465, 438/141–151, 107–113, 478–479  
See application file for complete search history.

(56) References Cited

U.S. PATENT DOCUMENTS

| | | | |
|---|---|---|---|
| 6,380,046 B1 | 4/2002 | Yamazaki |
| 6,485,993 B2 | 11/2002 | Trezza et al. |
| 7,199,024 B2 | 4/2007 | Yamazaki |
| 2002/0109144 A1 | 8/2002 | Yamazaki |
| 2007/0173000 A1 | 7/2007 | Yamazaki |
| 2008/0061301 A1 | 3/2008 | Yamazaki |
| 2008/0067529 A1 | 3/2008 | Yamazaki |
| 2008/0067597 A1 | 3/2008 | Yamazaki |
| 2008/0083953 A1 | 4/2008 | Yamazaki |
| 2008/0318367 A1 | 12/2008 | Shimomura et al. |
| 2009/0004821 A1 | 1/2009 | Shimomura et al. |
| 2009/0004823 A1 | 1/2009 | Shimomura et al. |

FOREIGN PATENT DOCUMENTS

JP   2000-012864   1/2000

*Primary Examiner* — Savitri Mulpuri  
(74) *Attorney, Agent, or Firm* — Eric J. Robinson; Robinson Intellectual Property Law Office, P.C.

(57) ABSTRACT

To provide a method of manufacturing a semiconductor device in which the space between semiconductor films transferred at plural locations is narrowed. A first bonding substrate having first projections is attached to a base substrate. Then, the first bonding substrate is separated at the first projections so that first semiconductor films are formed over the base substrate. Next, a second bonding substrate having second projections is attached to the base substrate so that the second projections are placed in regions different from regions where the first semiconductor films are formed. Subsequently, the second bonding substrate is separated at the second projections so that second semiconductor films are formed over the base substrate. In the second bonding substrate, the width of each second projection in a direction (a depth direction) perpendicular to the second bonding substrate is larger than the film thickness of each first semiconductor film formed first.

16 Claims, 20 Drawing Sheets

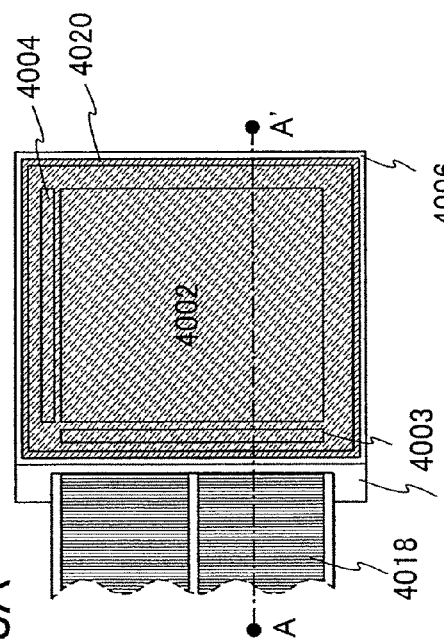
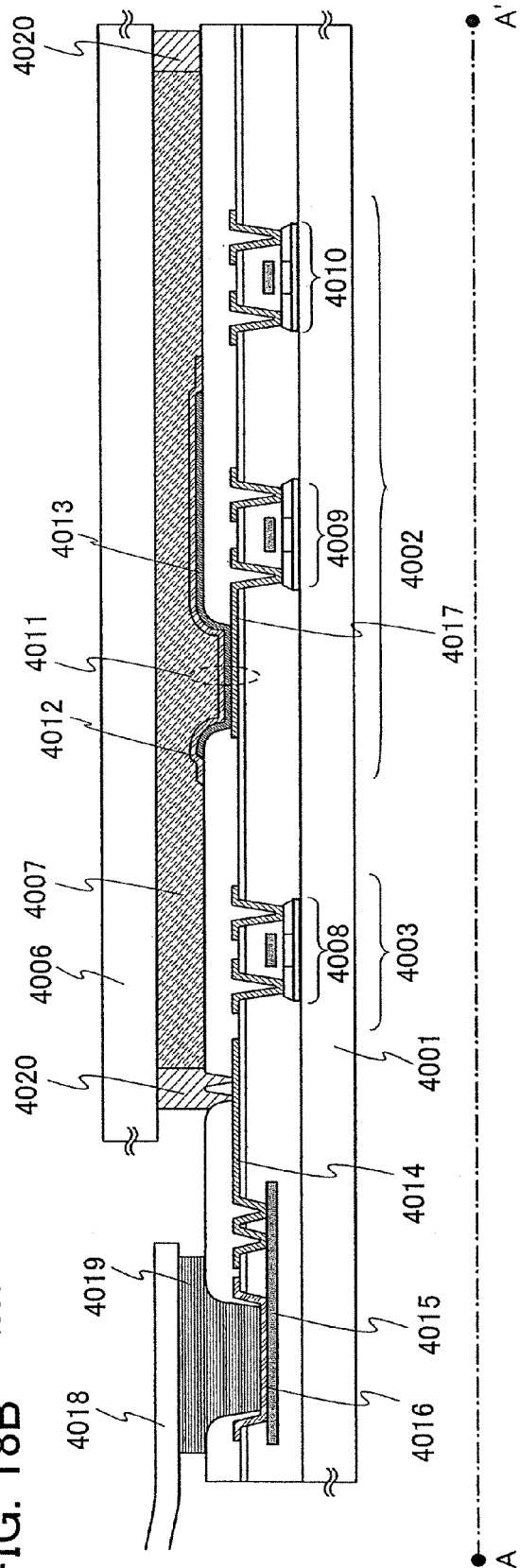
FIG. 18A
FIG. 18B

METHOD OF MANUFACTURING SEMICONDUCTOR DEVICE

BACKGROUND OF THE INVENTION

1. Field of the Invention

The present invention relates to a method of manufacturing a semiconductor device which uses an SOI (silicon on insulator) substrate. The present invention particularly relates to a bonding SOI technique, and to a method of manufacturing a semiconductor device which uses an SOI substrate obtained by attaching a single-crystal or polycrystalline semiconductor film to a substrate with an insulating film interposed between the semiconductor film and the substrate.

2. Description of the Related Art

Demands for higher integration, higher operation speed, higher performance, and lower power consumption in semiconductor integrated circuits have been more stringent, and in response to such demands, a transistor using an SOI substrate has attracted attention as effective means that can take place of a bulk transistor. Higher operation speed and lower power consumption can be expected more in a transistor using an SOI substrate than in a bulk transistor because a semiconductor film is formed over an insulating film in a transistor using an SOI substrate, and accordingly parasitic capacitance can be reduced and generation of leakage current flowing through the substrate can be suppressed. In addition, since a semiconductor film used as an active layer can be thinned, a short channel effect can be suppressed; thus, an element can be miniaturized, and accordingly higher integration of semiconductor integrated circuits can be realized. Moreover, since a transistor using an SOI substrate is a completely latch-up free transistor, there is no risk that the element will be broken due to heat caused by latch-up. Furthermore, a transistor using an SOI substrate does not need element isolation unlike a bulk transistor; thus, a transistor using an SOI substrate has advantages in that the distance between the elements can be shortened to achieve higher integration.

As one of methods of manufacturing an SOI substrate, there is a method in which a semiconductor film is attached to a substrate with an insulating film interposed therebetween, such as UNIBOND (registered trademark) typified by Smart-Cut (registered trademark), ELTRAN (epitaxial layer transfer), a dielectric separation method, or a PACE (plasma assisted chemical etching) method. The above-described bonding methods make it possible to form high-performance integrated circuits by using a single crystal semiconductor film, over a glass substrate which is inexpensive.

One of the examples of semiconductor devices using SOI substrates has been disclosed by Patent document 1: Japanese Published Patent Application No. 2000-012864.

SUMMARY OF THE INVENTION

Now, glass substrates used for manufacturing semiconductor devices such as flat-panel displays have become larger in area year by year as in the seventh generation (1900 mm×2200 mm) and the eighth generation (2160 mm×2460 mm). From now on, it is predicted that the substrates will have much larger area for the ninth generation (2400 mm×2800 mm, 2450 mm×3050 mm) and the tenth generation (2950 mm×3400 mm). With the increase in area of glass substrates, a larger number of semiconductor devices can be produced from one glass substrate, which can reduce production cost.

Meanwhile, general silicon substrates as one kind of semiconductor substrates have a diameter of 5 inches (125 mm), 6 inches (150 mm), 8 inches (200 mm), and 12 inches (300 mm), which are much smaller in size than glass substrates. Therefore, in a case of forming a semiconductor film over a large glass substrate from a semiconductor substrate, it is necessary to perform the formation at a plurality of locations. However, some semiconductor substrates warp, bend, or have a little round edge. Moreover, at the time of adding hydrogen ions for separating a semiconductor film from a semiconductor substrate, the hydrogen ions cannot be added sufficiently at an edge. As a result, it is difficult to transfer to the glass substrate, a portion of the semiconductor film that is located at the edge of the semiconductor substrate. When the semiconductor films are formed at a plurality of locations so that the semiconductor substrates do not overlap with each other, the space between the semiconductor films formed by the transfer enlarges and it becomes difficult to manufacture one semiconductor device for which the semiconductor films are used without the influence of the space between the semiconductor films.

In view of the aforementioned problems, it is an object of the present invention to narrow the space between the semiconductor films formed at a plurality of locations.

In the present invention, semiconductor films are formed over a base substrate (a supporting substrate) in a plurality of steps with the use of a bonding substrate (a semiconductor substrate) having a plurality of projections. In a case where a first semiconductor film formed first and a second semiconductor film formed later are provided adjacent to each other, a bonding substrate used for forming the second semiconductor film has a larger width than the film thickness of the first semiconductor film formed first. The width used here refers to a width in a direction (a depth direction) perpendicular to the bonding substrate having the plurality of projections.

In a specific method of manufacturing a semiconductor device of the present invention, a first bonding substrate having a plurality of first projections is attached to a base substrate. Then, the first bonding substrate is cleaved or separated at the plurality of first projections, whereby a plurality of first semiconductor films is formed over the base substrate. Next, a second bonding substrate having a plurality of second projections is attached to the base substrate so that the plurality of second projections is placed in regions different from the first semiconductor films over the base substrate. Then, the second bonding substrate is cleaved or separated at the plurality of second projections, whereby a plurality of second semiconductor films is formed over the base substrate.

It is to be noted that the second bonding substrate has a larger width than the film thickness of each of the first semiconductor films formed first. The width used here refers to a width in a direction (a depth direction) perpendicular to the second bonding substrate having the plurality of second projections. At the time of attaching the second bonding substrate to the base substrate, the aforementioned structure makes it possible to overlap the first semiconductor films with regions of the second bonding substrate other than the second projections.

Then, the plurality of projections of the bonding substrates are formed at a predetermined distance from the rims of the bonding substrates.

In the present invention, in the second bonding substrate used for forming the second semiconductor films, the width of each of the second projections in a direction (a depth direction) perpendicular to the second bonding substrate is larger than the film thickness of each of the first semiconductor films formed first. Therefore, the second bonding substrate can be attached to the base substrate so that the second bonding substrate is not in contact with the first semiconductor films formed first and so that the second bonding substrate overlaps with the first semiconductor films in regions other than the second projections. Accordingly, it is possible to narrow the spaces between the first semiconductor films formed first and the second semiconductor films formed later. Moreover, the semiconductor films can be formed over the base substrate with excellent reproducibility by forming the projections at a predetermined distance from the rims of the bonding substrates.

BRIEF DESCRIPTION OF THE DRAWINGS

FIG. 18A is a top view and FIG. 18B is a cross-sectional view, each showing a semiconductor display device manufactured in accordance with the present invention.

DETAILED DESCRIPTION OF THE INVENTION

Embodiment modes of the present invention will hereinafter be described with reference to the accompanying drawings. However, since the present invention can be implemented in many different modes, it is easily understood by those skilled in the art that the mode and detail of the present invention can be variously changed without departing from the scope and spirit of the present invention. Therefore, the present invention should not be construed as being limited to the description of the embodiment modes.

Embodiment Mode 1

This embodiment mode describes a method of manufacturing a semiconductor device of the present invention, in which semiconductor films are formed over a base substrate in a plurality of steps with the use of a bonding substrate.

Figure 1A:
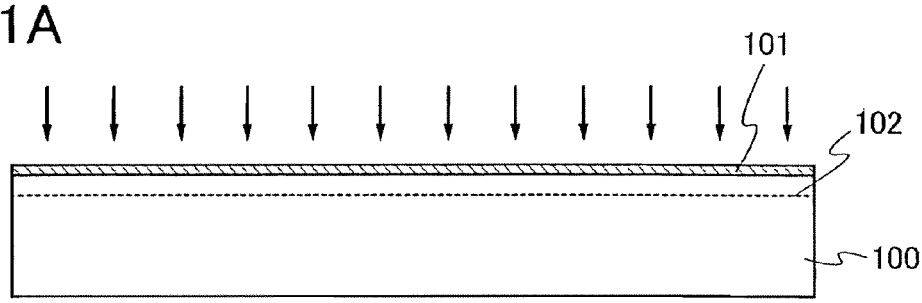
FIGS. 1A to 1C are cross-sectional views showing a method of manufacturing a semiconductor device of the present invention.

First, an insulating film 101 is formed over a bonding substrate 100, as shown in FIG. 1A. The bonding substrate 100 may be, for example, a single-crystal semiconductor substrate or a polycrystalline semiconductor substrate, which is formed of silicon, germanium, or the like. Alternatively, the bonding substrate 100 may be a single-crystal semiconductor substrate or a polycrystalline semiconductor substrate, which is formed of a compound semiconductor such as gallium arsenide or indium phosphide. Further alternatively, the bonding substrate 100 may be a semiconductor substrate formed of silicon having crystal lattice distortion, silicon germanium obtained by adding germanium to silicon, or the like. The silicon having lattice distortion can be formed over silicon germanium or silicon nitride having larger lattice constant than silicon.

The insulating film 101 is formed of an insulating material such as silicon oxide, silicon nitride oxide, silicon oxynitride, or silicon nitride. The insulating film 101 may be a single insulating film or a stack of plural insulating films. For example, in this embodiment mode, the insulating film 101 is formed by stacking silicon oxynitride containing a larger amount of oxygen than nitrogen and silicon nitride oxide containing a larger amount of nitrogen than oxygen in order from the side closer to the bonding substrate 100.

In a case of using the insulating film 101 formed of, for example, silicon oxide, the insulating film 101 can be formed by a vapor deposition method such as thermal CVD, plasma CVD, normal pressure CVD, or bias ECRCVD with the use of a mixed gas of silane and oxygen, a mixed gas of TEOS (tetraethoxysilane) and oxygen, or the like. In this case, a surface of the insulating film 101 may be subjected to oxygen plasma treatment to increase the density. Meanwhile, in a case of using the insulating film 101 formed of silicon nitride, the insulating film 101 can be formed by a vapor deposition method such as plasma CVD with the use of a mixed gas of silane and ammonia. Moreover, in a case of using the insulating film 101 formed of silicon nitride oxide, the insulating film 101 can be formed by a vapor deposition method such as plasma CVD with the use of a mixed gas of silane and ammonia or a mixed gas of silane and nitrogen oxide.

Alternatively, the insulating film 101 may be formed of silicon oxide by a chemical vapor deposition method with the use of an organic silane gas. As the organic silane gas, the following compound containing silicon can be used: tetraethyl orthosilicate tetraethoxysilane (TEOS, chemical formula: $Si(OC_2H_5)_4$), tetramethylsilane (TMS, chemical formula: Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), trisdimethylaminosilane (SiH(N(CH$_3$)$_2$)$_3$), or the like.

Next, as shown in FIG. 1A, hydrogen or a rare gas, or hydrogen ions or rare gas ions are added to the bonding substrate 100 as indicated by arrows to form a fragile layer 102 having a microvoid at a predetermined depth from a surface of the bonding substrate 100. The fragile layer 102 is formed at a position determined depending on the acceleration voltage at the time of the addition. Then, based on the position of the fragile layer 102, the thickness of each of semiconductor films 106a and 106b to be transferred from the bonding substrate 100 to a base substrate 104 is determined. Therefore, the acceleration voltage at the addition is set in consideration of the thickness of each of the semiconductor films 106a and 106b. The position of the fragile layer 102 can be changed not only by the acceleration voltage at the addition but also by the thickness of the insulating film 101. For example, when the insulating film 101 is formed to be thicker, the semiconductor films 106a and 106b can be formed to be thinner. The thickness of each of the semiconductor films 106a and 106b is set in the range of 10 nm to 200 nm, preferably 10 nm to 50 nm inclusive. For example, when hydrogen is added to the bonding substrate 100, the dosage is desirably set in the range of $1\times10^{16}$/cm$^2$ to $1\times10^{17}$/cm$^2$ inclusive. In this embodiment mode, hydrogen or hydrogen ions are added under the condition where the dosage is $1.75\times10^{16}$/cm$^2$ and the acceleration voltage is 40 kV.

In the aforementioned step of forming the fragile layer 102, hydrogen or a rare gas, or hydrogen ions or rare gas ions are added to the bonding substrate 100 at high concentration. Therefore, in some cases, the surface of the bonding substrate 100 becomes rough so that the bonding substrate 100 cannot be bonded to the base substrate 104 with sufficient strength. With the provision of the insulating film 101, the surface of the bonding substrate 100 is protected at the time of adding hydrogen or a rare gas, or hydrogen ions or rare gas ions. As a result, the base substrate 104 and the bonding substrate 100 can be bonded to each other favorably.

Figure 1B:
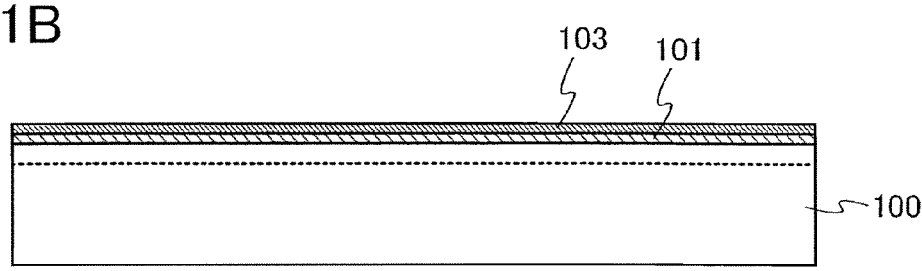

Next, an insulating film 103 is formed over the insulating film 101, as shown in FIG. 1B. The insulating film 103 is formed of an insulating material such as silicon oxide, silicon nitride oxide, silicon oxynitride, or silicon nitride in a similar manner to the insulating film 101. The insulating film 103 may be a single insulating film or a stack of plural insulating films. Alternatively, the insulating film 103 may be formed of silicon oxide by a chemical vapor deposition method with the use of an organic silane gas. In this embodiment mode, the insulating film 103 is formed of silicon oxide by a chemical vapor deposition method by using an organic silane gas.

When the insulating film 101 or the insulating film 103 is formed of silicon nitride, silicon nitride oxide, or the like which has a high barrier property, it is possible to prevent impurities such as an alkali metal and an alkaline earth metal in the base substrate 104 from entering the semiconductor films 106a and 106b formed over the base substrate 104.

In this embodiment mode, the insulating film 103 is formed after the formation of the fragile layer 102; however, the insulating film 103 is not always necessary. It is to be noted that since the insulating film 103 is formed after the formation of the fragile layer 102, the insulating film 103 has a flatter surface than the insulating film 101 formed before the formation of the fragile layer 102. Accordingly, the formation of the insulating film 103 can increase the strength of the bonding that is later performed.

Figure 1C:
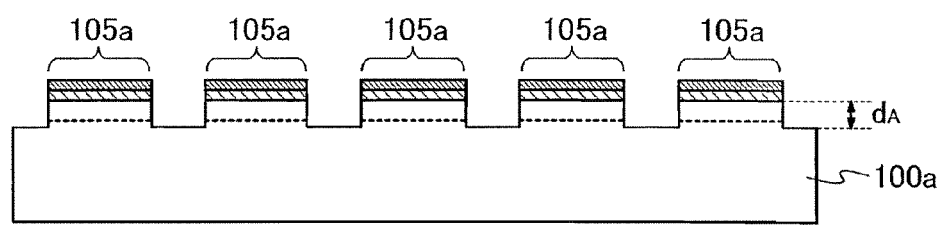
Figure 1C:
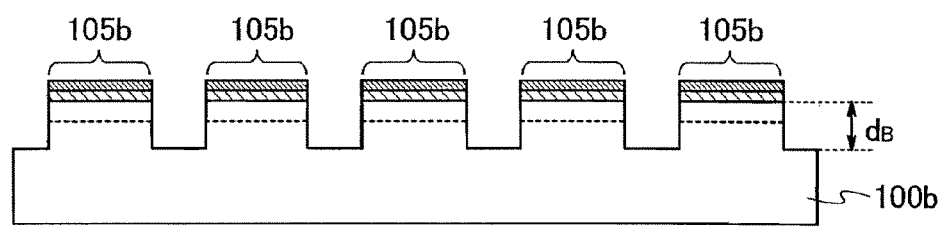

Subsequently, the bonding substrate 100 is partially removed. In this embodiment mode, as shown in FIG. 1C, a bonding substrate 100a having a plurality of projections 105a and a bonding substrate 100b having a plurality of projections 105b are formed by partially removing the bonding substrate 100 together with the insulating film 101 and the insulating film 103.

The bonding substrate 100a is used for forming the semiconductor films 106a. In the bonding substrate 100a, each of the plurality of projections 105a has a width d$_A$ in a direction (a depth direction) perpendicular to the bonding substrate 100a. The width d$_A$ is larger than or equal to the depth of the fragile layer 102. The bonding substrate 100b, on the other hand, is used for forming the semiconductor films 106b. In the bonding substrate 100b, each of the plurality of projections 105b has a width d$_B$ in a direction (a depth direction) perpendicular to the bonding substrate 100b. The width d$_B$ is larger than the thickness of each of the semiconductor films 106a formed first, i.e., the depth of the fragile layer 102. The width of each of the projections 105b in the direction (the depth direction) perpendicular to the bonding substrate 100b is not necessarily constant and may have different values depending on the location. However, when the projections 105b have different widths in the depth direction depending on the location, the width d$_B$ is defined as follows: when the bonding substrate 100b is attached to the base substrate 104 later, the difference in height between an end portion of the bonding substrate 100b and one of the projections 105b that is the closest to the semiconductor films 106a formed first corresponds to the width d$_B$.

Specifically, the width d$_A$ is set at, for example, 10 nm or more, preferably 200 nm or more in consideration of the thickness of the semiconductor film 106a. Moreover, the width d$_B$ is set at, for example, several micrometers or more, preferably 10 μm or more in consideration of the thickness of the semiconductor film 106a.

Although the width d$_A$ is smaller than the width d$_B$ in this embodiment mode, the present invention is not limited to this structure. The width d$_A$ may be equal to the width d$_B$ or may be larger than the width d$_B$.

The projections 105a of the bonding substrate 100a are formed at a predetermined distance from the rim of the bonding substrate 100a. In a similar manner, the projections 105b of the bonding substrate 100b are formed at a predetermined distance from the rim of the bonding substrate 100b. A part of the semiconductor film that is positioned at an edge of the bonding substrate is difficult to be transferred to the base substrate. Therefore, the projections are formed at a predetermined distance from the rim of the bonding substrate as aforementioned; thus, the semiconductor films can be formed over the base substrate with excellent reproducibility. As a result, the position of the bonding substrate 100b which is later attached can be matched easily, which can further narrow the space between the semiconductor film 106a and the semiconductor film 106b.

For example, it is preferable that the projections 105a or 105b that are positioned closest to the edge of the substrate have a distance of several tens of micrometers to several tens of millimeters from the rim of the bonding substrate 100a or 100b.

Next, the bonding substrate 100a and the bonding substrate 100b may be subjected to hydrogenation treatment before attaching each of the bonding substrate 100a and the bonding substrate 100b to the base substrate 104 by bonding. The hydrogenation treatment is performed, for example, at 350° C. for about two hours in a hydrogen atmosphere.

Figure 2A:
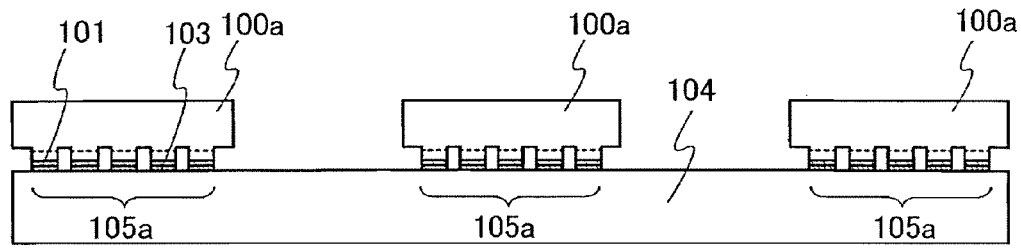
FIGS. 2A to 2D are cross-sectional views showing a method of manufacturing a semiconductor device of the present invention.

Then, as shown in FIG. 2A, the bonding substrate 100a and the base substrate 104 are attached to each other so that the projections 105a face the base substrate 104, i.e., so that the insulating film 101 and the insulating film 103 are interposed between the bonding substrate 100a and the base substrate 104. The bonding substrate 100a and the base substrate 104 can be attached to each other in such a way that the insulating film 103 and the base substrate 104 are bonded to each other at the projections 105a.

Since the bonding is performed by Van der Vaals force, firm bonding can be obtained even at room temperature. Since the aforementioned bonding can be performed at low temperature, the base substrate 104 can be formed of any of a variety of materials. For example, the base substrate 104 may be a glass substrate made of aluminosilicate glass, barium borosilicate glass, aluminoborosilicate glass, or the like, a quartz substrate, a sapphire substrate, or the like. Alternatively, the base substrate 104 may be, for example, a semiconductor substrate made of silicon, gallium arsenide, indium phosphide, or the like. Further alternatively, the base substrate 104 may be a metal substrate including a stainless steel substrate.

Heat treatment or pressurization treatment may be performed after attaching the base substrate 104 and the bonding substrate 100a to each other. By the heat treatment or pressurization treatment, the bonding strength can be improved.

Figure 2B:
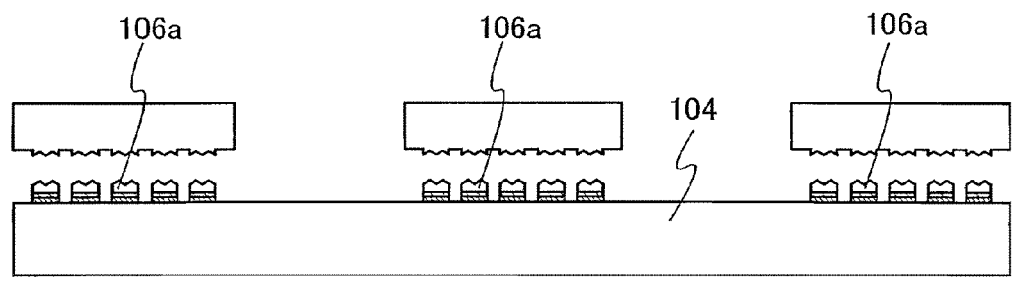

When the heat treatment is performed after attaching the bonding substrate 100a and the base substrate 104 to each other by bonding, microvoids adjacent to each other in the fragile layer 102 are combined, whereby the microvoids increase in volume. As a result, as shown in FIG. 2B, the bonding substrate 100a is cleaved or separated at the fragile layer 102, so that the semiconductor films 106a which used to serve as a part of the projections 105a are separated from the bonding substrate 100a. The heat treatment is preferably performed at temperatures at or below the upper temperature limit of the base substrate 104; for example, the temperature in this heat treatment is in the range of 400° C. to 600° C. inclusive. By this separation, the plural semiconductor films 106a are transferred to the base substrate 104 together with the insulating film 101 and the insulating film 103. After that, another heat treatment is preferably performed at temperatures ranging from 400° C. to 600° C. inclusive in order to further strengthen the bonding between the insulating film 103 and the base substrate 104.

Figure 2C:
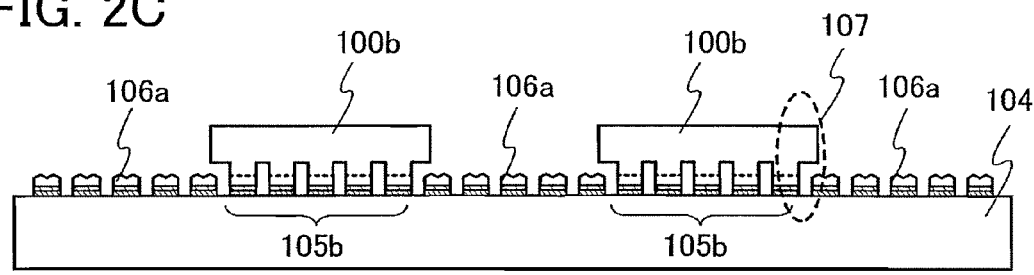

Next, as shown in FIG. 2C, the bonding substrate 100b and the base substrate 104 are attached to each other so that the projections 105b face the base substrate 104, i.e., so that the insulating film 101 and the insulating film 103 are interposed between the bonding substrate 100b and the base substrate 104. The bonding substrate 100b and the base substrate 104 can be attached to each other in such a way that the insulating film 103 and the base substrate 104 are bonded to each other at the projections 105b.

The bonding substrate 100b is bonded so that the projections 105b are placed in regions other than the semiconductor films 106a formed first. As can be seen from a portion enclosed by a dotted line 107, in the present invention, the projections 105b can be disposed as close to the semiconductor films 106a as the semiconductor films 106a overlaps with regions of the bonding substrate 100b other than the projections 105b without the bonding substrate 100b being in contact with the semiconductor films 106a. In specific, the distance between the semiconductor film 106a formed first and the semiconductor film 106b formed later can be shortened to be as small as several tens of micrometers, and a semiconductor device can be manufactured using the semiconductor films 106a and the semiconductor films 106b without the influence of the space between the semiconductor films 106a and the semiconductor films 106b.

Since the bonding is performed by Van der Vaals force similar to the previous formation of the semiconductor films 106a, firm bonding can be obtained even at room temperature. However, heat treatment or pressurization treatment may be performed after attaching the base substrate 104 and the bonding substrate 100b to each other. By the heat treatment or pressurization treatment, the bonding strength can be improved.

Figure 2D:
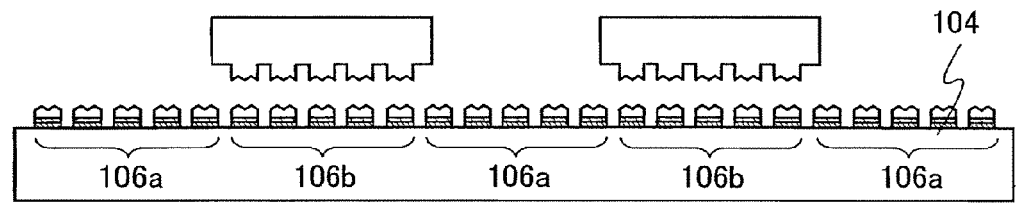

When the heat treatment is performed after attaching the bonding substrate 100b and the base substrate 104 to each other by bonding, microvoids adjacent to each other in the fragile layer 102 are combined, whereby the microvoids increase in volume. As a result, as shown in FIG. 2D, the bonding substrate 100b is cleaved or separated at the fragile layer 102, so that the semiconductor films 106b which used to serve as a part of the projections 105b are separated from the bonding substrate 100b. The heat treatment is preferably performed at temperatures at or below the upper temperature limit of the base substrate 104; for example, the temperature in this heat treatment is in the range of 400° C. to 600° C. inclusive. By this separation, the plural semiconductor films 106b are transferred to the base substrate 104 together with the insulating film 101 and the insulating film 103. After that, another heat treatment is preferably performed at temperatures ranging from 400° C. to 600° C. inclusive in order to further strengthen the bonding between the insulating film 103 and the base substrate 104.

The crystal plane orientation of the semiconductor films 106a and the semiconductor films 106b can be controlled by the plane orientation of the bonding substrate 100a and the bonding substrate 100b, respectively. The bonding substrate 100a and the bonding substrate 100b which have crystal plane orientation appropriate for semiconductor elements to be formed may be selected as appropriate. Moreover, the mobility of a transistor depends on the crystal plane orientation of the semiconductor films 106a and the semiconductor films 106b. In order to form a transistor with higher mobility, a direction in which the bonding substrate 100a and the bonding substrate 100b are attached to each other is determined in consideration of a channel direction and the crystal plane orientation.

It is to be noted that the base substrate 104 may be provided with an insulating film on its surface. In this case, the base substrate 104 is attached to the bonding substrate 100a and the bonding substrate 100b by bonding the insulating film 103 and the insulating film formed on the surface of the base substrate 104. With the provision of the insulating film on the surface of the base substrate 104, it is possible to prevent impurities such as an alkali metal or an alkaline earth metal in the base substrate 104 from entering the semiconductor films 106a and 106b.

Figure 3A:
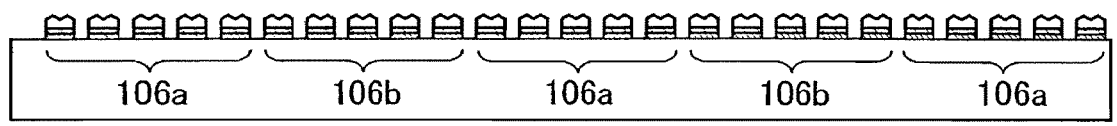
FIGS. 3A and 3B are cross-sectional views showing a method of manufacturing a semiconductor device of the present invention.
Figure 3B:
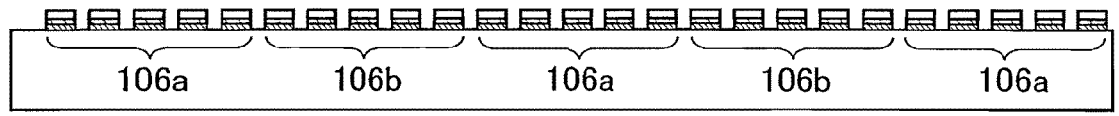

After forming the semiconductor films 106a and the semiconductor films 106b as shown in FIG. 3A, the surfaces of the semiconductor films 106a and the semiconductor films 106b are flattened as shown in FIG. 3B. The flattening is not always necessary; however, the flattening makes it possible to improve characteristics of an interface between a gate insulating film and the semiconductor films 106a and the semiconductor films 106b in later formed transistors. In specific, the flattening can be performed by chemical mechanical polishing (CMP), liquid jet polishing, or the like. The thickness of each of the semiconductor films 106a and the semiconductor films 106b is decreased by the flattening.

The semiconductor films 106a and the semiconductor films 106b may be irradiated with an energy beam to recover crystal defects. As the energy beam, a beam selectively absorbed in the semiconductor films 106a and the semiconductor films 106b is used; for example, a laser beam is desirably used. As the laser beam, a laser beam emitted from a gas laser such as an excimer laser or a solid state laser such as a YAG laser can be used. The laser beam is preferably the one with a wavelength in the range of ultraviolet light to visible light regions; specifically, a laser beam with a wavelength of 190 nm to 700 nm is desirable. Alternatively, flash lamp annealing which uses a halogen lamp, a xenon lamp, or the like may be performed to recover crystal defects.

After forming the semiconductor films 106a and the semiconductor films 106b, the edges of the semiconductor films 106a and the semiconductor films 106b that do not have enough strength of bonding may be removed by further etching the semiconductor films 106a and the semiconductor films 106b. The above etching may be performed either before or after the flattening of the surfaces of the semiconductor films 106a and the semiconductor films 106b.

This embodiment mode shows a case of using a Smart Cut (registered trademark) method by which the semiconductor films 106a and the semiconductor films 106b are separated from the bonding substrate 100a and the bonding substrate 100b, respectively by formation of the fragile layer 102. Alternatively, another bonding method such as ELTRAN (Epitaxial Layer Transfer), a dielectric separation method, or a PACE (plasma assisted chemical etching) method may be used.

With the use of the semiconductor films 106a and the semiconductor films 106b formed through the aforementioned steps, various kinds of semiconductor elements such as a transistor can be formed in accordance with the present invention.

Figure 4A:
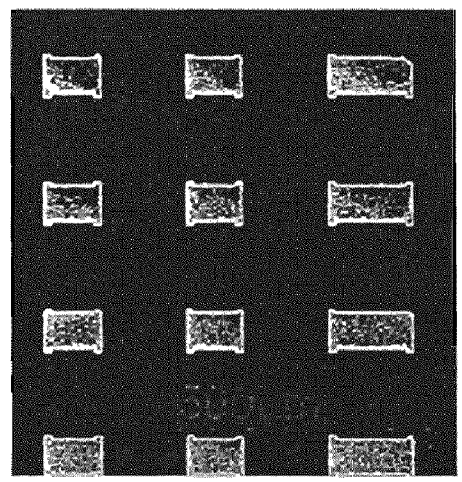
FIGS. 4A to 4C are optical micrographs of semiconductor films each formed over a base substrate.
Figure 4B:
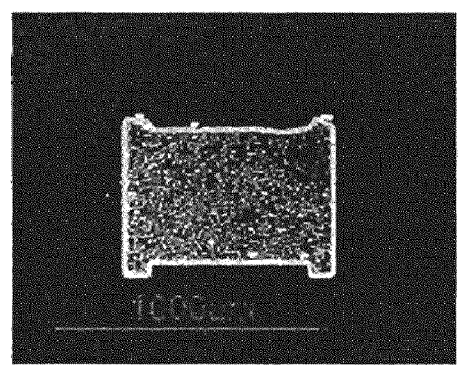
Figure 4C:
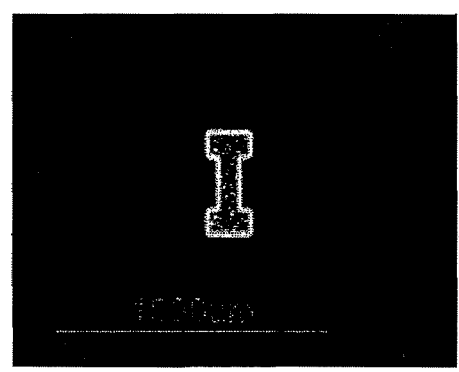

FIGS. 4A to 4C are optical micrographs each showing a semiconductor film formed over a glass substrate by a manufacturing method of this embodiment mode. FIG. 4B is a magnified optical micrograph which shows one of the semiconductor films shown in FIG. 4A. FIG. 4C is an optical micrograph showing a different semiconductor film from those shown in FIGS. 4A and 4B.

The samples shown in FIGS. 4A to 4C are the ones formed over one base substrate by using one bonding substrate. A single-crystal silicon substrate was used as the bonding substrate 100, and an aluminosilicate glass substrate (AN 100) manufactured by ASAHI GLASS Co., Ltd: was used as the base substrate 104. The insulating film 101 was formed by stacking, over the silicon substrate, a 50-nm-thick silicon oxynitride film containing a larger amount of oxygen than nitrogen and a 100-nm-thick silicon nitride oxide film containing a larger amount of nitrogen than oxygen in this order. After forming the insulating film 101, the fragile layer 102 was formed by hydrogen doping. The hydrogen doping was performed under the condition where the flow rate of 100% hydrogen gas was 50 sccm, the beam current density was 5 μA/cm$^2$, the accelerating voltage was 80 kV, and the dosage was 2.0×10$^{16}$ atoms/cm$^2$. Subsequently, a silicon oxide film was formed as the insulating film 103 in 100 nm thick over the insulating film 101 by a chemical vapor deposition method with the use of TEOS (tetraethoxysilane). Next, the insulating film 101, the insulating film 103, and the silicon substrate were partially etched away to form a plurality of projections, and then attached to the base substrate, i.e., the aluminosilicate glass substrate, by bonding. Then, the silicon substrate was separated at the fragile layer 102, whereby a semiconductor film with a thickness of about 180 nm was formed over the aluminosilicate glass substrate.

Figure 20:
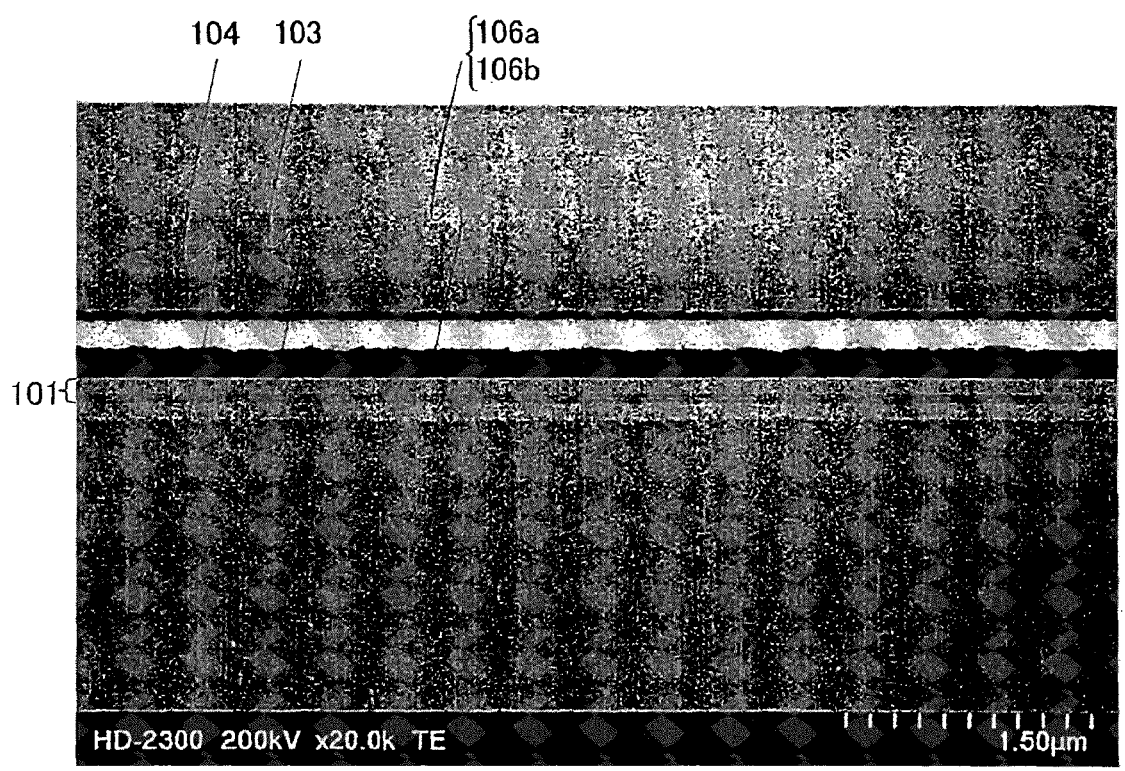
FIG. 20 shows a TEM image of a semiconductor film formed over a base substrate.

FIG. 20 shows a TEM image of the samples shown in FIGS. 4A to 4C, which was taken by a scanning transmission electron microscope (STEM). In FIG. 20, the insulating film 103 formed using TEOS, the insulating film 101 formed by stacking the silicon nitride oxide film containing a larger amount of nitrogen than oxygen and the silicon oxynitride film containing a larger amount of oxygen than nitrogen, and the semiconductor film 106a (or the semiconductor film 106b) are stacked in order over the base substrate 104 which is the aluminosilicate glass substrate.

The present invention can be applied in manufacturing any kind of semiconductor devices including microprocessors, integrated circuits such as image processing circuits, RF tags for transmitting and receiving data with an interrogator without contact, semiconductor display devices, and the like. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

Embodiment Mode 2

This embodiment mode describes arrangement of semiconductor films formed over a base substrate.

Figure 5A:
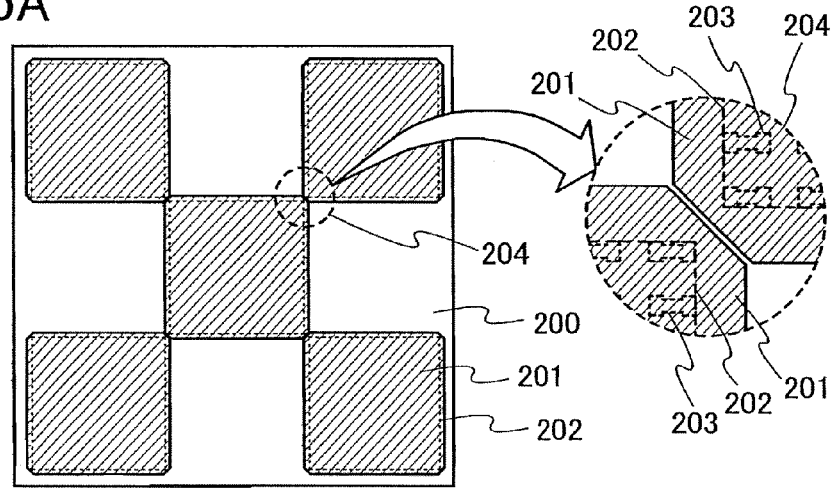
FIGS. 5A to 5C are top views showing a method of manufacturing a semiconductor device of the present invention.

FIG. 5A is a top view of a base substrate 200 to which a plurality of bonding substrates 201 is attached, and a magnified view of a region 204 surrounded by a dotted line in the top view is also shown. The bonding substrates 201 are disposed in different regions so as not to overlap with each other. Each of the bonding substrates 201 has a plurality of projections 203 in a region 202 surrounded by a dotted line and is attached to the base substrate 200 so that the projections 203 face the base substrate 200.

Although each of the bonding substrates 201 shown in FIG. 5A has a shape like a rectangle having four corners cut off into triangles, the present invention is not limited to this structure. Each of the bonding substrates 201 may have a rectangular shape or may have a shape like a rectangle having four rounded corners. However, as can be seen from the magnified view of the region 204 surrounded by the dotted line, the bonding substrates 201 each having, instead of having a rectangular shape, a shape with edges at four corners of a rectangle cut off or rounded makes it possible to shorten the distance between the projections 203 between the adjacent bonding substrates 201. Accordingly, the spaces between semiconductor films 205 formed using the adjacent bonding substrates 201 can be narrowed.

In a case where each of the bonding substrates 201 has an orientation flat or a flat portion that indicates a plane orientation or a crystal direction of a substrate, it is desirable that the projections 203 be formed so as not to overlap with such a flat portion.

Figure 5B:
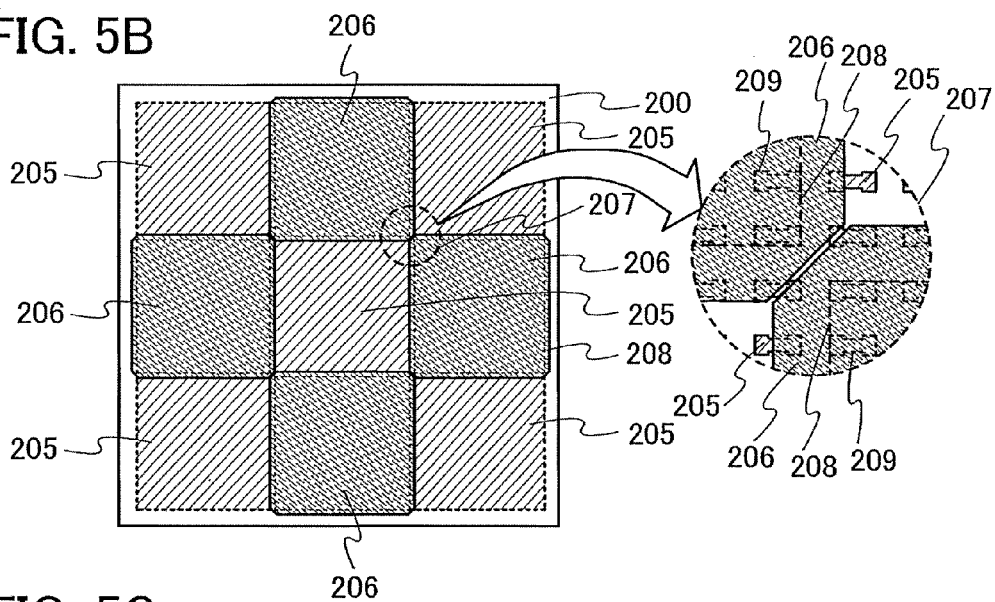

After attaching the bonding substrates 201 to the base substrate 200 as shown in FIG. 5A, the semiconductor films 205 are formed over the base substrate 200 by cleaving or separating the bonding substrates 201 at the projections 203. Subsequently, a plurality of bonding substrates 206 is attached to the base substrate 200. FIG. 5B is a top view of the base substrate 200 to which the bonding substrates 206 are attached, and a magnified view of a region 207 surrounded by a dotted line in the top view is also shown.

In a similar manner to the bonding substrates 201, the bonding substrates 206 are placed in different regions so as not to overlap with each other. Each of the bonding substrates 206 has a plurality of projections 209 in a region 208 surrounded by a dotted line, and is attached to the base substrate 200 so that the projections 209 face the base substrate 200. The bonding substrates 206 and the semiconductor films 205 may partially overlap with each other; however, the projections 209 of each of the bonding substrates 206 are placed in regions different from regions where the semiconductor films 205 are formed.

Although each of the bonding substrate 206 shown in FIG. 5B has a shape like a rectangle having four corners cut off into triangles in a similar manner to the bonding substrates 201, the present invention is not limited to this structure. Each of the bonding substrates 206 may have a rectangular shape or may have a shape like a rectangle having four rounded corners. However, the bonding substrates 206 each having, instead of a rectangular shape, a shape with edges at four corners of a rectangle cut off or rounded makes it possible to shorten the distance between the projections 209 between the adjacent bonding substrates 206. Accordingly, the spaces between semiconductor films 210 formed using the adjacent bonding substrates 206 can be narrowed.

In a case where each of the bonding substrates 206 has an orientation flat or a flat portion that indicates a plane orientation or a crystal direction of a substrate, it is desirable that the projections 209 be formed so as not to overlap with such a flat portion.

Figure 5C:
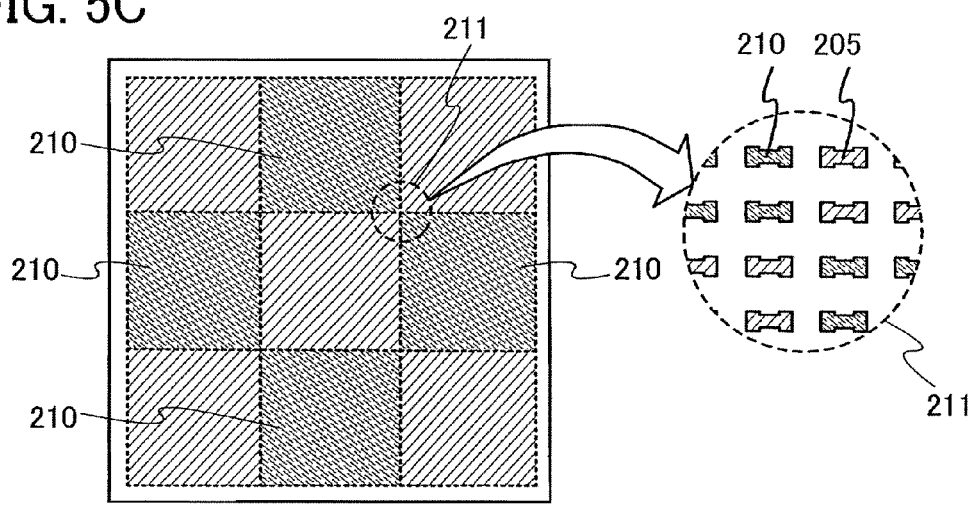

After attaching the bonding substrates 206 to the base substrate 200 as shown in FIG. 5B, the semiconductor films 210 can be formed over the base substrate 200 by cleaving or separating the bonding substrates 206 at the projections 209. FIG. 5C is a top view of the base substrate 200 over which the semiconductor films 205 and the semiconductor films 210 are formed, and a magnified view of a region 211 surrounded by a dotted line in the top view is also shown.

In the present invention, the width of each of the projections 209 in a direction (a depth direction) perpendicular to the bonding substrates 206 is larger than the thickness of each of the semiconductor films 205 formed first. Therefore, the semiconductor films 210 can be formed later so that the bonding substrates 206 are not in contact with the semiconductor films 205 formed first and so that the semiconductor films 205 formed first overlap with regions of the bonding substrates 206 other than the projections 209. Thus, the distance between the semiconductor films 205 formed first and the semiconductor films 210 formed afterward can be shortened to about several tens of micrometers, and a semiconductor device can be manufactured using the semiconductor films 205 and 210 without the influence of the space between the semiconductor films 205 and 210.

The projections 203 of the bonding substrates 201 are formed at a predetermined distance from the rims of the bonding substrates 201. In a similar manner, the projections 209 of the bonding substrates 206 are formed at a predetermined distance from the rims of the bonding substrates 206. A part of the semiconductor film that is positioned at an edge of the bonding substrate is difficult to be transferred to the base substrate. Therefore, the projections are formed at a predetermined distance from the rim of the bonding substrate as aforementioned; thus, the semiconductor films can be formed over the base substrate with excellent reproducibility.

This embodiment mode can be implemented in combination with the above embodiment mode as appropriate.

Embodiment Mode 3

This embodiment mode describes arrangement of semiconductor films formed over a base substrate.

Figure 6A:
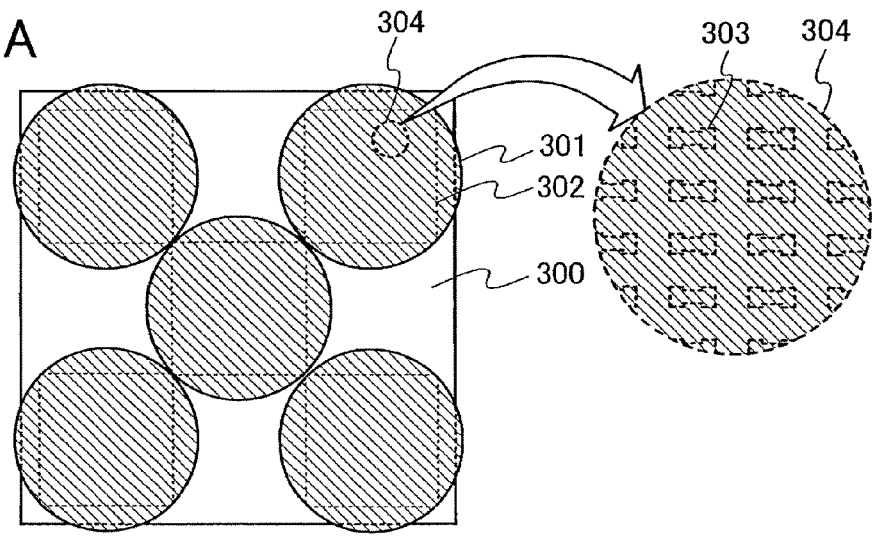
FIGS. 6A to 6C are top views showing a method of manufacturing a semiconductor device of the present invention.

FIG. 6A is a top view of a base substrate 300 to which a plurality of circular bonding substrates 301 is attached, and a magnified view of a region 304 surrounded by a dotted line in the top view is also shown. The bonding substrates 301 are arranged in different regions so as not to overlap with each other. Each of the bonding substrates 301 has a plurality of projections 303 in a region 302 surrounded by a dotted line and is attached to the base substrate 300 so that the projections 303 face the base substrate 300.

In a case where each bonding substrate 301 has a notch portion or a flat portion that indicates a plane orientation, it is desirable that the projections 303 be formed so as not to overlap with such a portion.

Figure 6B:
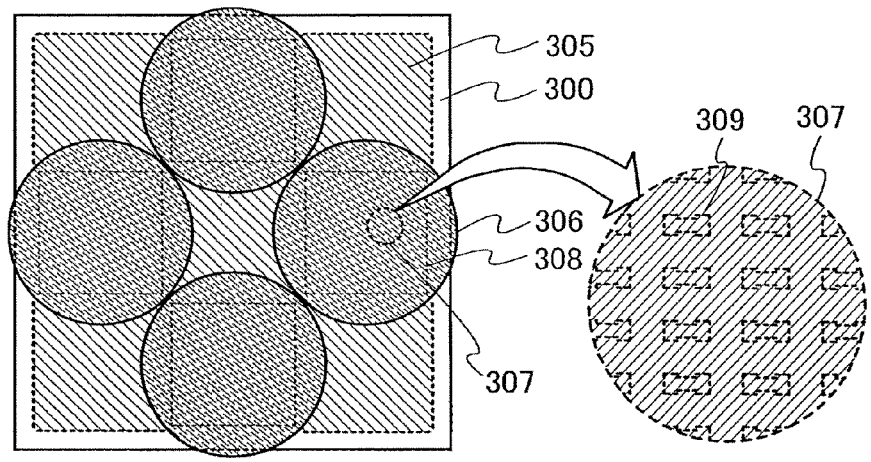

After attaching the bonding substrates 301 to the base substrate 300 as shown in FIG. 6A, the bonding substrates 301 are cleaved or separated at the projections 303, whereby semiconductor films 305 are formed over the base substrate 300. Subsequently, a plurality of bonding substrates 306 is attached to the base substrate 300. FIG. 6B is a top view of the base substrate 300 to which the bonding substrates 306 are attached, and a magnified view of a region 307 surrounded by a dotted line in the top view is also shown.

In a similar manner to the bonding substrates 301, the bonding substrates 306 are arranged in different regions so as not to overlap with each other. Each of the bonding substrates 306 has a plurality of projections 309 in a region 308 surrounded by a dotted line and is attached to the base substrate 300 so that the projections 309 face the base substrate 300. The bonding substrates 306 and the semiconductor films 305 may partially overlap with each other; however, the projections 309 of each of the bonding substrates 306 are placed in regions different from regions where the semiconductor films 305 are formed.

In a case where the bonding substrate 306 has a notch portion or a flat portion that indicates a plane orientation, it is desirable that the projections 309 be formed so as not to overlap with such a portion.

Figure 6C:
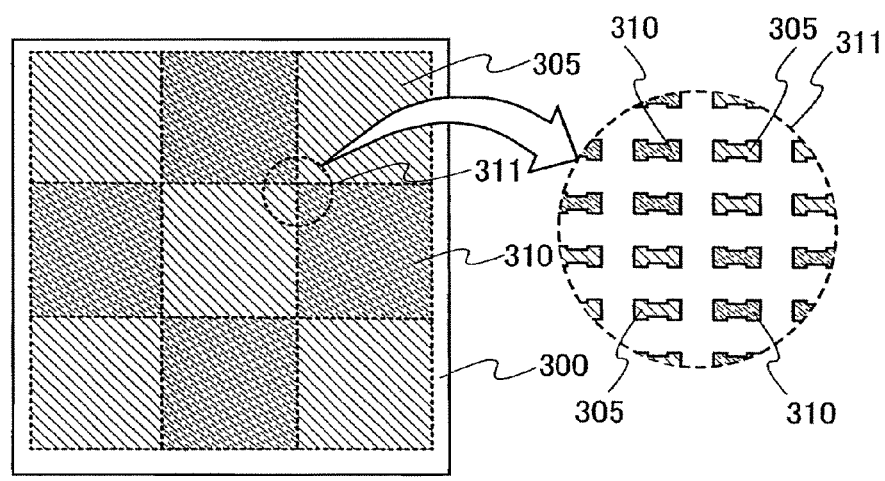

After attaching the bonding substrates 306 to the base substrate 300 as shown in FIG. 6B, the bonding substrates 306 are cleaved or separated at the projections 309, whereby semiconductor films 310 are formed over the base substrate 300. FIG. 6C is a top view of the base substrate 300 over which the semiconductor films 305 and the semiconductor films 310 are formed, and a magnified view of a region 311 surrounded by a dotted line in the top view is also shown.

In the present invention, the width of each of the projections 309 in a direction (a depth direction) perpendicular to the bonding substrates 306 is larger than the thickness of each of the semiconductor films 305 formed first. Therefore, the semiconductor films 310 can be formed later so that the bonding substrates 306 are not in contact with the semiconductor films 305 formed first and so that the semiconductor films 305 formed first overlap with regions of the bonding substrates 306 other than the projections 309. Thus, the distance between the semiconductor films 305 formed first and the semiconductor films 310 formed afterward can be shortened to about several tens of micrometers, and a semiconductor device can be manufactured using the semiconductor films 305 and 310 without the influence of the space between the semiconductor films 305 and 310.

The projections 303 of the bonding substrates 301 are formed at a predetermined distance from the rims of the bonding substrates 301. In a similar manner, the projections 309 of the bonding substrates 306 are formed at a predetermined distance from the rims of the bonding substrates 306. A part of the semiconductor film that is positioned at an edge of the bonding substrate is difficult to be transferred to the base substrate. Therefore, the projections are formed at a predetermined distance from the rim of the bonding substrate as aforementioned; thus, the semiconductor films can be formed over the base substrate with excellent reproducibility.

This embodiment mode can be implemented in combination with the above embodiment mode as appropriate.

Embodiment Mode 4

This embodiment mode describes arrangement of semiconductor films formed over a base substrate.

Figure 7A:
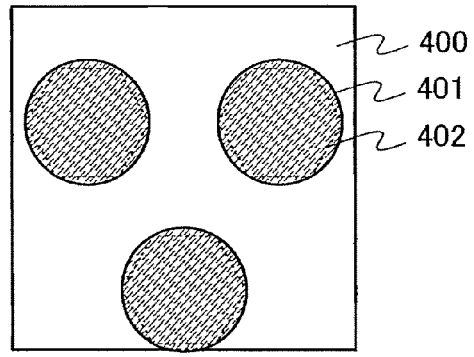
FIGS. 7A to 7D are top views showing a method of manufacturing a semiconductor device of the present invention.

FIG. 7A is a top view of a base substrate 400 to which a plurality of circular bonding substrates 401 is attached. The bonding substrates 401 are arranged in different regions so as not to overlap with each other. Each of the bonding substrates 401 has a plurality of projections in a region 402 surrounded by a dotted line and is attached to the base substrate 400 so that the projections face the base substrate 400. It is to be noted that this embodiment mode shows a case where the region 402 including the projections has a regular hexagonal shape.

In a case where the bonding substrate 401 has a notch portion or a flat portion that indicates a plane orientation, it is desirable that the projections be formed so as not to overlap with such a portion.

Figure 7B:
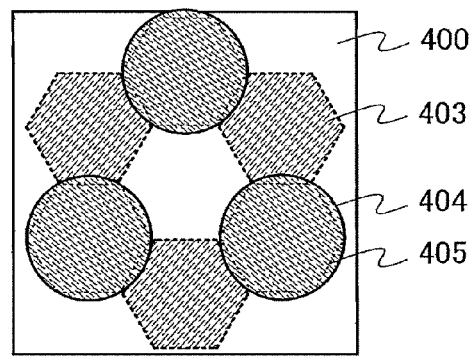

After attaching the bonding substrates 401 to the base substrate 400 as shown in FIG. 7A, the bonding substrates 401 are cleaved or separated at the projections, whereby semiconductor films 403 are formed over the base substrate 400. Next, a plurality of bonding substrates 404 is attached to the base substrate 400. FIG. 7B is a top view of the base substrate 400 to which the bonding substrates 404 are attached.

In a similar manner to the bonding substrates 401, the bonding substrates 404 are arranged in different regions so as not to overlap with each other. Each of the bonding substrates 404 has a plurality of projections in a region 405 surrounded by a dotted line and is attached to the base substrate 400 so that the projections face the base substrate 400. The bonding substrates 404 and the semiconductor films 403 may partially overlap with each other; however, the projections of each of the bonding substrates 404 are placed in regions different from regions where the semiconductor films 403 are formed. It is to be noted that this embodiment mode shows a case where the region 405 including the projections has a regular hexagonal shape.

In a case where the bonding substrate 404 has a notch portion or a flat portion that indicates a plane orientation, it is desirable that the projections be formed so as not to overlap with such a portion.

Figure 7C:
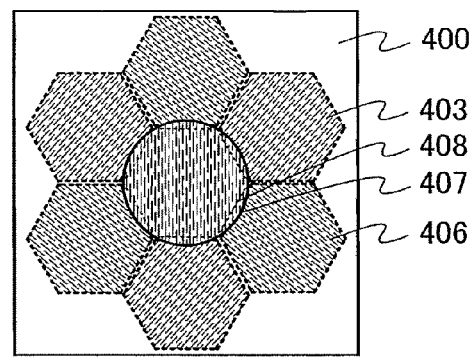

After attaching the bonding substrates 404 to the base substrate 400 as shown in FIG. 7B, the bonding substrates 404 are cleaved or separated at the projections, whereby semiconductor films 406 are formed over the base substrate 400. Next, a bonding substrate 407 is attached to the base substrate 400. FIG. 7C is a top view of the base substrate 400 to which the bonding substrate 407 is attached.

The bonding substrate 407 has a plurality of projections in a region 408 surrounded by a dotted line and is attached to the base substrate 400 so that the projections face the base substrate 400. The bonding substrate 407, the semiconductor films 403, and the semiconductor films 406 may partially overlap with each other; however, the projections of the bonding substrate 407 are placed in regions different from regions where the semiconductor films 403 and the semiconductor films 406 are formed. It is to be noted that this embodiment mode shows a case where the region 408 including the projections has a regular hexagonal shape.

In a case where the bonding substrate 407 has a notch portion or a flat portion that indicates a plane orientation, it is desirable that the projections be formed so as not to overlap with such a portion.

Figure 7D:
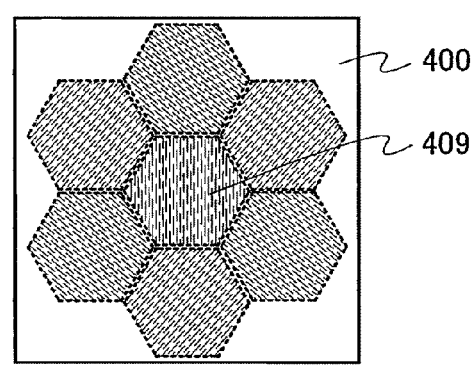

After attaching the bonding substrate 407 to the base substrate 400 as shown in FIG. 7C, the bonding substrate 407 is cleaved or separated at the projections, whereby a semiconductor film 409 can be formed over the base substrate 400 as shown in FIG. 7D.

In the present invention, the width of each of the projections in a direction (a depth direction) perpendicular to the bonding substrates is larger than the thickness of each of the semiconductor films formed first. Therefore, the semiconductor films can be formed later so that the bonding substrates are not in contact with the semiconductor films formed first and so that the semiconductor films formed first overlap with regions of the bonding substrates other than the projections. Thus, the distance between the semiconductor films formed first and the semiconductor films formed afterward can be shortened to about several tens of micrometers, and a semiconductor devices can be manufactured using the semiconductor films without the influence of the space between the semiconductor films.

The projections of the bonding substrate are formed at a predetermined distance from the rim of the bonding substrate. A part of the semiconductor film that is positioned at an edge of the bonding substrate is difficult to be transferred to the base substrate. Therefore, the projections are formed at a predetermined distance from the rim of the bonding substrate as aforementioned; thus, the semiconductor films can be formed over the base substrate with excellent reproducibility.

Although each of the regions 402, 405, and 408 including the projections has a regular hexagonal shape in this embodiment mode, the present invention is not limited to this structure. Each of these regions including the projections may have a polygonal shape with three sides, four sides, five sides, seven sides or more, or may have a shape including a curve line such as a circular shape or an elliptical shape. However, in the case where the region including the projections has a regular triangular shape, a square shape, a rectangular shape, or a regular hexagonal shape, the semiconductor films can be spread all over allowing no unnecessary space therebetween over the base substrate 400. In particular, when the region including the projections has a regular hexagonal shape, there are advantages in that the semiconductor films can spread all over with no unnecessary space therebetween over the base substrate 400, and moreover that the area of the semiconductor film over the base substrate, which is obtained by using one circular bonding substrate, can be maximized.

This embodiment mode can be implemented in combination with the above embodiment mode as appropriate.

Embodiment Mode 5

This embodiment mode describes a method of manufacturing a semiconductor device of the present invention, in which semiconductor films are formed in a plurality of steps over a base substrate with the use of a bonding substrate.

Figure 8A:
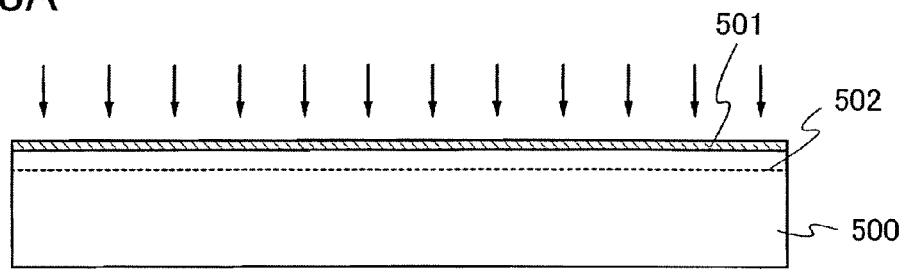
FIGS. 8A to 8C are cross-sectional views showing a method of manufacturing a semiconductor device of the present invention.

As shown in FIG. 8A, an insulating film 501 is formed over a bonding substrate 500. The bonding substrate 500 may be, for example, a single-crystal semiconductor substrate or a polycrystalline semiconductor substrate formed of silicon, germanium, or the like. Alternatively, the bonding substrate 500 may be a single-crystal semiconductor substrate or a polycrystalline semiconductor substrate formed of a compound semiconductor such as gallium arsenide or indium phosphide. Further alternatively, the bonding substrate 500 may be a semiconductor substrate formed of silicon having crystal lattice distortion, silicon germanium obtained by adding germanium to silicon, or the like. The silicon having distortion can be formed over silicon germanium or silicon nitride having larger lattice constant than silicon.

The insulating film 501 can be formed of an insulating material such as silicon oxide, silicon nitride oxide, silicon oxynitride, or silicon nitride. The insulating film 501 may be a single insulating film or a stack of plural insulating films. For example, in this embodiment mode, the insulating film 501 is formed by stacking silicon oxynitride containing a larger amount of oxygen than nitrogen and silicon nitride oxide containing a larger amount of nitrogen than oxygen in order from the side closer to the bonding substrate 500.

In a case of using the insulating film 501 formed of, for example, silicon oxide, the insulating film 501 can be formed by a vapor deposition method such as thermal CVD, plasma CVD, normal pressure CVD, or bias ECRCVD with the use of a mixed gas of silane and oxygen, a mixed gas of TEOS (tetraethoxysilane) and oxygen, or the like. In this case, a surface of the insulating film 501 may be subjected to oxygen plasma treatment to increase the density. Alternatively, in a case of using silicon as the bonding substrate 500, a surface of the bonding substrate 500 can be oxidized thermally to form silicon oxide, which serves as the insulating film 501. Meanwhile, in a case of using the insulating film 501 formed of silicon nitride, the insulating film 501 can be formed by a vapor deposition method such as plasma CVD with the use of a mixed gas of silane and ammonia. Moreover, in a case of using the insulating film 501 formed of silicon nitride oxide, the insulating film 501 can be formed by a vapor deposition method such as plasma CVD with the use of a mixed gas of silane and ammonia or a mixed gas of silane and nitrogen oxide.

Alternatively, the insulating film 501 may be formed of silicon oxide by a chemical vapor deposition method with the use of an organic silane gas. As the organic silane gas, the following compound containing silicon can be used: tetraethyl orthosilicate tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like.

Next, as shown in FIG. 8A, hydrogen or a rare gas, or hydrogen ions or rare gas ions are added to the bonding substrate 500 as indicated by arrows to form a fragile layer 502 having a microvoid at a predetermined depth from a surface of the bonding substrate 500. The fragile layer 502 is formed at a position determined by the acceleration voltage at the time of the addition. Then, based on the position of the fragile layer 502, the thickness of each of semiconductor films 506a and 506b to be transferred from the bonding substrate 500 to the base substrate 504 is determined Therefore, the acceleration voltage at the addition is set in consideration of the thickness of each of semiconductor films 506a and semiconductor films 506b. The position of the fragile layer 502 can be changed not only by the acceleration voltage at the addition but also by the thickness of the insulating film 501. For example, when the insulating film 501 is formed to be thicker, the semiconductor films 506a and 506b can be formed to be thinner. The thickness of each of the semiconductor films 506a and 506b is set in the range of from 10 nm to 200 nm, preferably 10 nm to 50 nm inclusive. For example, when hydrogen is added to the bonding substrate 500, the dosage is desirably set in the range of $1\times10^{16}/cm^2$ to $1\times10^{17}/cm^2$ inclusive.

In the aforementioned step of forming the fragile layer 502, hydrogen or a rare gas, or hydrogen ions or rare gas ions are added to the bonding substrate 500 at high concentration. Therefore, in some cases, the surface of the bonding substrate 500 becomes rough so that the bonding substrate 500 cannot be bonded to the base substrate 504 with sufficient strength. With the provision of the insulating film 501, the surface of the bonding substrate 500 is protected at the time of adding hydrogen or a rare gas, or hydrogen ions or rare gas ions. As a result, the base substrate 504 and the bonding substrate 500 can be bonded to each other favorably.

Figure 8B:
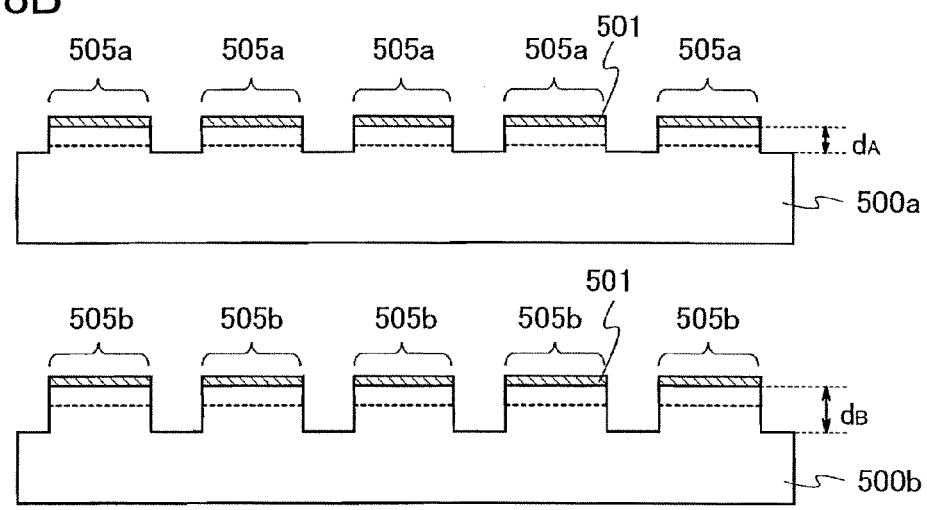

Subsequently, the bonding substrate 500 is partially removed. In this embodiment mode, as shown in FIG. 8B, a bonding substrate 500a having a plurality of projections 505a and a bonding substrate 500b having a plurality of projections 505b are formed by partially removing the bonding substrate 500 together with the insulating film 501.

The bonding substrate 500a is used for forming the semiconductor films 506a. In the bonding substrate 500a, each of the plurality of projections 505a has a width $d_A$ in a direction (a depth direction) perpendicular to the bonding substrate 500a. The width $d_A$ is larger than or equal to the depth of the fragile layer 502. The bonding substrate 500b, on the other hand, is used for forming the semiconductor films 506b. In the bonding substrate 500b, each of the plurality of projections 505b has a width $d_B$ in a direction (a depth direction) perpendicular to the bonding substrate 500b. The width $d_B$ is larger than the thickness of each of the semiconductor films 506a formed first, i.e., the depth of the fragile layer 502. The width of each of the projections 505b in the direction (a depth direction) perpendicular to the bonding substrate 500b is not necessarily constant and may have different values depending on the location. However, when the projections 505b have different widths in the depth direction depending on the location, the width $d_B$ is defined as follows: when the bonding substrate 500b is attached to the base substrate 504 later, the difference in height between an end portion of the bonding substrate 500b and one of the projections 505b that is closest to the semiconductor films 506a formed first corresponds to the width $d_B$.

Specifically, the width $d_A$ is set at, for example, 10 nm or more, preferably 200 nm or more in consideration of the thickness of the semiconductor films 506a. Moreover, the width $d_B$ is set at, for example, several micrometers or more, preferably 10 µm or more in consideration of the thickness of the semiconductor film 506b.

Although the width $d_A$ is smaller than the width $d_B$ in this embodiment mode, the present invention is not limited to this structure. The width $d_A$ may be equal to the width $d_B$ or may be larger than the width $d_B$.

The projections 505a of the bonding substrate 500a are formed at a predetermined distance from the rim of the bonding substrate 500a. The projections 505b of the bonding substrate 500b are formed at a predetermined distance from the rim of the bonding substrate 500b. A part of the semiconductor film that is positioned at an edge of the bonding substrate is difficult to be transferred to the base substrate. Therefore, the projections are formed at a predetermined distance from the rim of the bonding substrate as aforementioned; thus, the semiconductor films can be formed over the base substrate with excellent reproducibility. As a result, the position of the bonding substrate 500b which is later attached can be matched easily, which can shorten the distance between the semiconductor film 506a and the semiconductor film 506b.

For example, it is preferable that the projections 505a or 505b that are positioned closest to the edge of the substrate have a distance of several tens micrometers to several tens millimeters from the rim of the bonding substrate 500a or 500b.

Figure 8C:
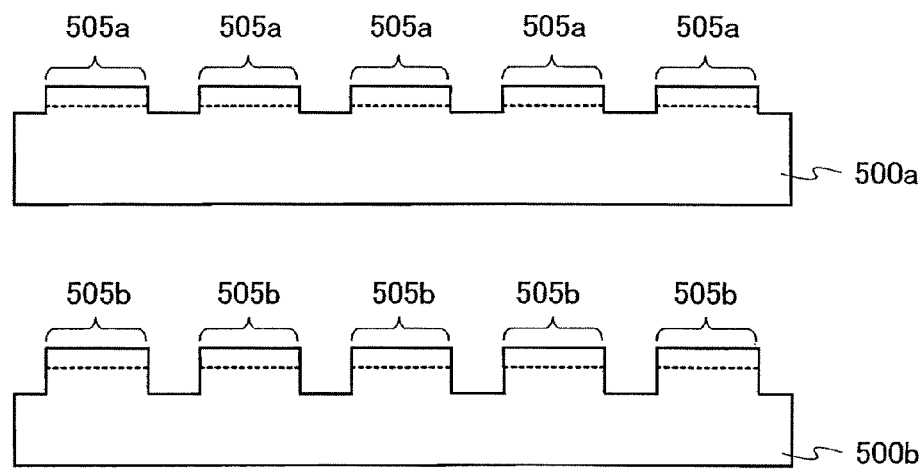

Next, the insulating film 501 formed over the projections 505a and 505b is removed as shown in FIG. 8C. Although the insulating film 501 is not necessarily removed, in a case where the insulating film 501 has a rough surface due to the aforementioned doping for forming the fragile layer 502, the removal of the insulating film 501 makes it possible to use the surfaces of the projections 505a and the projections 505b, which are flatter, for bonding. Thus, bonding force can be increased further.

In a case of adding the aforementioned hydrogen or a rare gas, or hydrogen ions or rare gas ions with the use of an ion doping apparatus of an ion shower type, impurities such as a heavy metal element remain in the insulating film 501 in some cases. By the removal of the insulating film 501, the impurities can be removed together with the insulating film 501.

After removing the insulating film 501, an insulating film may be formed over the projections 505a and the projections 505b. In this case, this insulating film is desirably formed of an insulating material such as silicon oxide, silicon nitride oxide, or silicon nitride, with a thickness of from 1 nm to 50 nm. Alternatively, the insulating film may be formed of silicon oxide by a chemical vapor deposition method with the use of an organic silane gas. The insulating film may be a single insulating film or a stack of plural insulating films. It is to be noted that an insulating film formed by hydro oxidation or plasma oxidation is unlikely to have an uneven surface caused by dust and can have a highly flat surface, differently from an insulating film formed by a vapor deposition method. Therefore, by the formation of the insulating film over the projections 505a and the projections 505b by hydro oxidation or plasma oxidation, the bonding performed later can be strengthened further.

The bonding substrate 500a and the bonding substrate 500b may be subjected to hydrogenation treatment before attaching each of the bonding substrate 500a and the bonding substrate 500b to the base substrate 504 by bonding. The hydrogenation treatment is performed, for example, at 350° C. for about two hours in a hydrogen atmosphere.

Figure 9A:
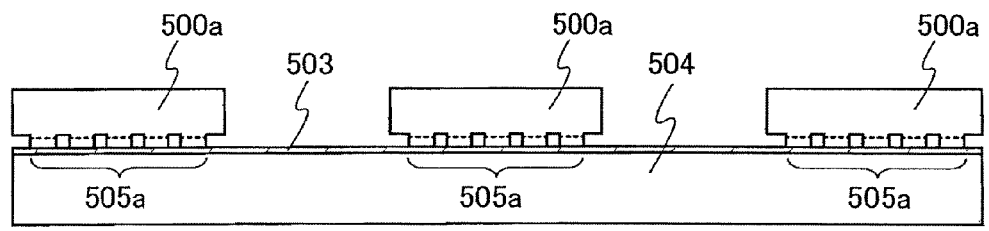
FIGS. 9A to 9D are cross-sectional views showing a method of manufacturing a semiconductor device of the present invention.

Subsequently, as shown in FIG. 9A, an insulating film 503 is formed over the base substrate 504. In a similar manner to the insulating film 501, the insulating film 503 is formed of an insulating material such as silicon oxide, silicon nitride oxide, silicon oxynitride, or silicon nitride. The insulating film 503 may be a single insulating film or a stack of plural insulating films. Moreover, the insulating film 503 may be formed of silicon oxide by a chemical vapor deposition method with the use of an organic silane gas.

When the insulating film 503 is an insulating film with a high barrier property such as a silicon nitride film or a silicon nitride oxide film, it is possible to prevent impurities such as an alkali metal and an alkaline earth metal in the base substrate 504 from entering the semiconductor films 506a and 506b formed over the base substrate 504.

In this embodiment mode, the insulating film 503 is formed by stacking a silicon nitride oxide film containing a larger amount of nitrogen than oxygen, a silicon oxynitride film containing a larger amount of oxygen than nitrogen, and a silicon oxide film manufactured by a chemical vapor deposition method with the use of an organic silane gas in order from the side closer to the base substrate 504.

Next, as shown in FIG. 9A, the bonding substrate 500a and the base substrate 504 are attached to each other so that the projections 505a face the base substrate 504, i.e., so that the insulating film 503 is interposed between the bonding substrate 500a and the base substrate 504. The bonding substrate 500a and the base substrate 504 can be attached to each other by bonding the insulating film 503 and the base substrate 500a to each other at the projections 505a.

Since the bonding is performed by Van der Vaals force, firm bond can be obtained even at room temperature. Since the aforementioned bonding can be performed at low temperature, the base substrate 504 can be formed of any of a variety of materials. For example, the base substrate 504 can be a glass substrate made of aluminosilicate glass, barium borosilicate glass, aluminoborosilicate glass, or the like, a quartz substrate, a sapphire substrate, or the like. Alternatively, the base substrate 504 may be a semiconductor substrate formed of silicon, gallium arsenide, indium phosphide, or the like. Further alternatively, the base substrate 504 may be a metal substrate including a stainless steel substrate.

Heat treatment or pressurization treatment may be performed after attaching the base substrate 504 and the bonding substrate 500a to each other. By the heat treatment or pressurization treatment, the bonding strength can be improved.

Figure 9B:
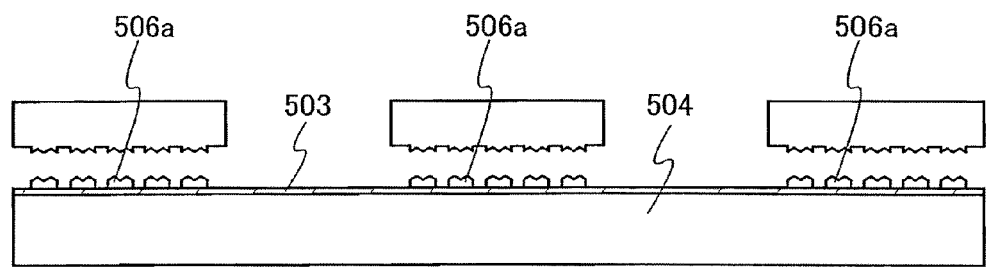

When the heat treatment is performed after attaching the bonding substrate 500a and the base substrate 504 to each other by bonding, microvoids adjacent to each other in the fragile layer 502 are combined, whereby the microvoids increase in volume. As a result, as shown in FIG. 9B, the bonding substrate 500a is cleaved or separated at the fragile layer 502, so that the semiconductor films 506b which used to serve as a part of the projections 505a are separated from the bonding substrate 500a. The heat treatment is preferably performed at temperatures at or below the upper temperature limit of the base substrate 504; for example, the temperature in this heat treatment is in the range of from 400° C. to 600° C. inclusive. By this separation, the plural semiconductor films 506a are transferred to the base substrate 504. After that, another heat treatment is preferably performed at temperatures ranging from 400° C. to 600° C. inclusive in order to further strengthen the bonding between the insulating film 503 and the semiconductor films 506a.

Figure 9C:
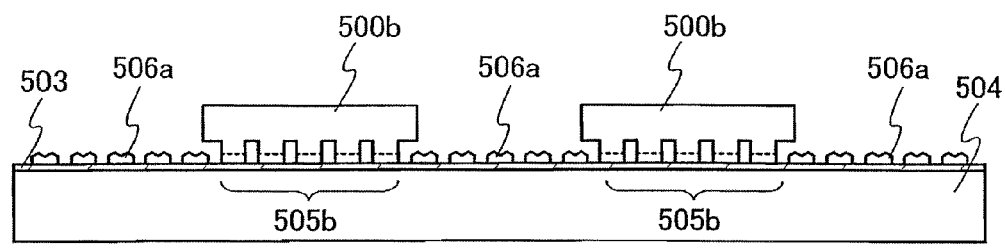

Next, as shown in FIG. 9C, the bonding substrate 500b and the base substrate 504 are attached to each other so that the projections 505b face the base substrate 504, i.e., so that the insulating film 503 is interposed between the bonding substrate 500b and the base substrate 504. The bonding substrate 500b and the base substrate 504 can be attached to each other by bonding the insulating film 503 and the base substrate 500b to each other at the projections 505b.

The bonding substrate 500b is bonded so that the projections 505b are placed in regions other than the semiconductor films 506a formed first. As can be seen from a portion enclosed by a dotted line 507, in the present invention, the projections 505b can be disposed as close to the semiconductor films 506a as the semiconductor films 506a overlaps with regions of the bonding substrate 500b other than the projections 505b without the bonding substrate 500b being in contact with the semiconductor films 506a. In specific, the distance between the semiconductor films 506a formed first and the semiconductor films 506b formed afterward can be shortened to be as small as several tens of micrometers, and a semiconductor device can be manufactured using the semiconductor films 506a and 506b without the influence of the space between the semiconductor films 506a and 506b.

Since the bonding is performed by Van der Vaals force similar to the formation of the previous semiconductor films 506a, firm bond can be obtained even at room temperature. However, heat treatment or pressurization treatment may be performed after attaching the base substrate 504 and the bonding substrate 500b to each other. By the heat treatment or pressurization treatment, the bonding strength can be improved.

Figure 9D:
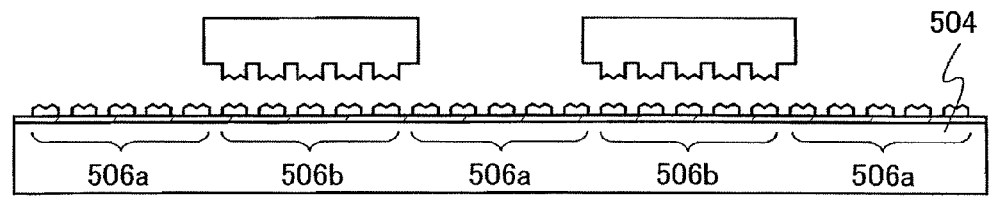

When the heat treatment is performed after attaching the bonding substrate 500b and the base substrate 504 to each other by bonding, microvoids adjacent to each other in the fragile layer 502 are combined, whereby the microvoids increase in volume. As a result, as shown in FIG. 9D, the bonding substrate 500b is cleaved or separated at the fragile layer 502, so that the semiconductor films 506b which used to serve as a part of the projections 505b are separated from the bonding substrate 500b. The heat treatment is preferably performed at temperatures at or below the upper temperature limit of the base substrate 504; for example, the temperature is in the range of from 400° C. to 600° C. inclusive. By this separation, the plural semiconductor films 506b are transferred to the base substrate 504. After that, another heat treatment is preferably performed at temperatures ranging from 400° C. to 600° C. inclusive in order to further strengthen the bonding between the insulating film 503 and the semiconductor films 506b.

The crystal plane orientation of the semiconductor films 506a and the semiconductor films 506b can be controlled by the plane orientation of the bonding substrate 500a and the bonding substrate 500b, respectively. The bonding substrate 500a and the bonding substrate 500b which have crystal plane orientation appropriate for semiconductor elements to be formed may be selected as appropriate. Moreover, the mobility of a transistor depends on the crystal plane orientation of the semiconductor films 506a and the semiconductor films 506b. In order to form a transistor with higher mobility, a direction in which the bonding substrate 500a and the bonding substrate 500b are attached to each other is determined in consideration of a channel direction and the crystal plane orientation.

The base substrate 504 is not necessarily provided with the insulating film 503 on its surface. In this case, the base substrate 504 is attached to the bonding substrate 500a and the bonding substrate 500b by directly bonding the base substrate 504 to the bonding substrate 500a and the bonding substrate 500b. With the provision of the insulating film on the surface of the base substrate 504, however, it is possible to prevent impurities such as an alkali metal or an alkaline earth metal in the base substrate 504 from entering the semiconductor films 506a and 506b. Moreover, when the insulating film 503 is formed on the surface of the base substrate 504, the bonding is performed between the insulating film 503 and each of the bonding substrate 500a and the bonding substrate 500b; therefore, the bonding can be carried out not depending on the kind of the base substrate 504.

Figure 10A:
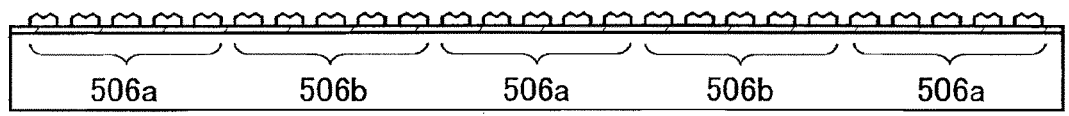
FIGS. 10A and 10B are cross-sectional views showing a method of manufacturing a semiconductor device of the present invention.
Figure 10B:
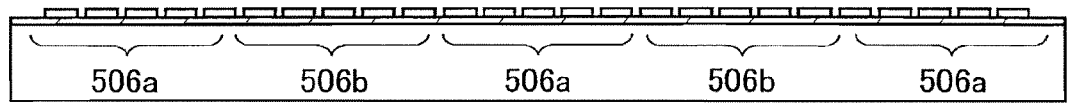

After forming the semiconductor films 506a and the semiconductor films 506b as shown in FIG. 10A, the surfaces of the semiconductor films 506a and the semiconductor films 506b are flattened as shown in FIG. 10B. The flattening is not always necessary; however, the flattening makes it possible to improve characteristics of an interface between a gate insulating film and the semiconductor films 506a and the semiconductor films 506 in later formed transistors. In specific, the flattening is performed by chemical mechanical polishing (CMP), liquid jet polishing, or the like. The thickness of each of the semiconductor films 506a and the semiconductor films 506b is decreased by the flattening.

The semiconductor films 506a and the semiconductor films 506b may be irradiated with an energy beam to recover crystal defects. As the energy beam, a beam selectively absorbed in the semiconductor films 506a and the semiconductor films 506b is used; for example, a laser beam is desirably used. As the laser beam, a laser beam emitted from a gas laser such as an excimer laser or a solid laser such as a YAG laser can be used. The laser beam is preferably the one with a wavelength in the range of ultraviolet light to visible light region; specifically, a laser beam with a wavelength of 190 nm to 700 nm is desirable. Alternatively, flash lamp annealing which uses a halogen lamp, a xenon lamp, or the like may be performed to recover crystal defects.

This embodiment mode will show a case of using a Smart Cut (registered trademark) method in which the semiconductor films 506a and the semiconductor films 506b are separated from the bonding substrate 500a and the bonding substrate 500b, respectively, by formation of the fragile layer 502. Alternatively, another bonding method such as ELTRAN (Epitaxial Layer Transfer), a dielectric separation method, or a PACE (plasma assisted chemical etching) method may be used.

With the use of the semiconductor films 506a and the semiconductor films 506b formed through the aforementioned steps, a variety of semiconductor elements such as a transistor can be formed in accordance with the present invention.

This embodiment mode can be implemented in combination with the above embodiment mode as appropriate.

Embodiment Mode 6

This embodiment mode describes a mode of a method for cleaving or separating the bonding substrate that is used in the method of manufacturing a semiconductor device shown in Embodiment Mode 1 or 5.

First, in this embodiment mode, hydrogen or a rare gas, or hydrogen ions or rare gas ions are added to the bonding substrate to form a fragile layer having a microvoid in a region at a predetermined depth from a surface of the bonding substrate. Then, after attaching the bonding substrate and the base substrate to each other by bonding, heat treatment is performed selectively on the bonding substrate by dielectric heating with high frequency waves such as microwaves, instead of performing heat treatment all over the bonding substrate and the base substrate.

The heat treatment by the dielectric heating can be performed by irradiating the bonding substrate with high frequency waves generated at a high-frequency generator, which is in the range of 300 MHz to 3 THz inclusive. In this embodiment mode, the bonding substrate is irradiated with a microwave with a frequency of 2.45 GHz at 900 W for 14 minutes so that the microvoids adjacent to each other in the fragile layer are combined, whereby the bonding substrate is cleaved or separated.

In this embodiment mode, a substrate that does not absorb but transmits the high frequency is used as the base substrate. For example, the base substrate can be a glass substrate made of aluminosilicate glass, barium borosilicate glass, aluminoborosilicate glass, or the like; a ceramic substrate such as a substrate made of silicon carbide; a sapphire substrate; or the like.

If heat treatment is performed all over the bonding substrate and the base substrate for cleaving or separating the bonding substrate at the fragile layer, the base substrate may undergo change in quality such as shrinking depending on the kind of the material of the base substrate. In the case where the bonding substrate is cleaved or separated over the base substrate in a plurality of steps like in the present invention, heating the bonding substrate selectively can prevent the base substrate from changing in quality and prevent the formation of the semiconductor film in and after the second step from having a trouble due to the change in quality of the base substrate.

This embodiment mode can be implemented in combination with the above embodiment mode as appropriate.

Embodiment Mode 7

This embodiment mode describes a specific example of a method of manufacturing a transistor used in the present invention.

Figure 11A:
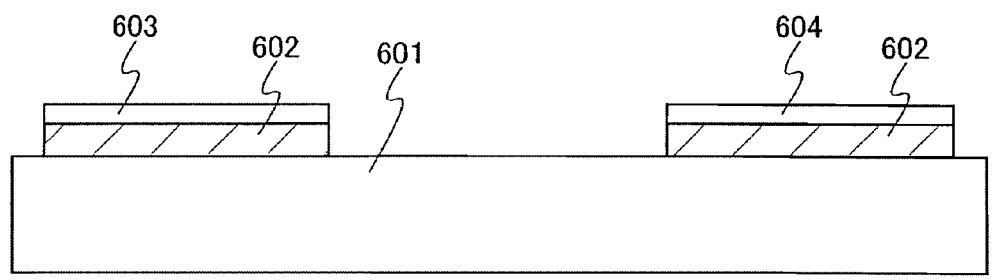
FIGS. 11A to 11D are cross-sectional views showing a method of manufacturing a semiconductor device of the present invention.

First, as shown in FIG. 11A, an island-shaped semiconductor film 603 and an island-shaped semiconductor film 604 are formed over a base substrate 601. An insulating film 602 is provided between the base substrate 601 and each of the island-shaped semiconductor film 603 and the island-shaped semiconductor film 604. The insulating film 602 may be formed by stacking plural insulating films or may be formed by a single insulating film.

An impurity may be added to the island-shaped semiconductor films 603 and 604 in order to control the threshold voltage. For example, in a case of adding boron as an impurity imparting p-type conductivity, boron may be added at a concentration of $5 \times 10^{17}$ cm$^{-3}$ to $1 \times 10^{18}$ cm$^{-3}$. The impurity addition for controlling the threshold voltage may be carried out either before or after the formation of the semiconductor films over the base substrate 601.

Moreover, hydrogenation treatment may be performed after forming the island-shaped semiconductor films 603 and 604 and before forming a gate insulating film 606. The hydrogenation treatment is performed, for example, in a hydrogen atmosphere at 350° C. for about two hours.

Figure 11B:

Next, as shown in FIG. 11B, the gate insulating film 606 is formed so as to cover the island-shaped semiconductor films 603 and 604. The gate insulating film 606 can be formed by oxidizing or nitriding surfaces of the island-shaped semiconductor films 603 and 604 through high-density plasma treatment. The high-density plasma treatment is performed using, for example, a mixed gas of a rare gas such as He, Ar, Kr, or Xe and any of oxygen, nitrogen oxide, ammonia, nitrogen, hydrogen, and the like. In this case, plasma with low electron temperature and high density can be produced by performing plasma excitation through introduction of microwaves. The surfaces of the semiconductor films are oxidized or nitrided by oxygen radicals (which include OH radicals in some cases) or nitrogen radicals (which include NH radical in some cases) produced by such high-density plasma, whereby an insulating film of 1 nm to 20 nm thick, desirably 5 nm to 10 nm thick, is formed in contact with the semiconductor films. This insulating film of 5 nm to 10 nm thick is used as the gate insulating film 606.

Since the oxidation or nitridation of the semiconductor films by the high-density plasma treatment is a solid-phase reaction, the interface state density between the gate insulating film 606 and each of the island-shaped semiconductor films 603 and 604 can be drastically decreased. Moreover, the variation in thickness of the insulating film can be suppressed to be low by directly oxidizing or nitriding the semiconductor films by the high-density plasma treatment. In a case where the semiconductor films have crystallinity, the oxidation of the surface of the semiconductor films in a solid-phase reaction by the high-density plasma treatment makes it possible to suppress fast oxidation only at the crystal boundaries and to form the gate insulating film with favorable uniformity and low interface state density. A transistor including the insulating film formed by the high-density plasma as a part of or the whole gate insulating film can have low variation in characteristics.

Alternatively, the gate insulating film 606 may be formed by thermally oxidizing the island-shaped semiconductor films 603 and 604. The gate insulating film 606 may be formed as a single layer or a stack of plural layers of a film including silicon oxide, silicon oxynitride, silicon nitride oxide, silicon nitride, hafnium oxide, aluminum oxide, or tantalum oxide by a plasma CVD method, a sputtering method, or the like.

Figure 11C:
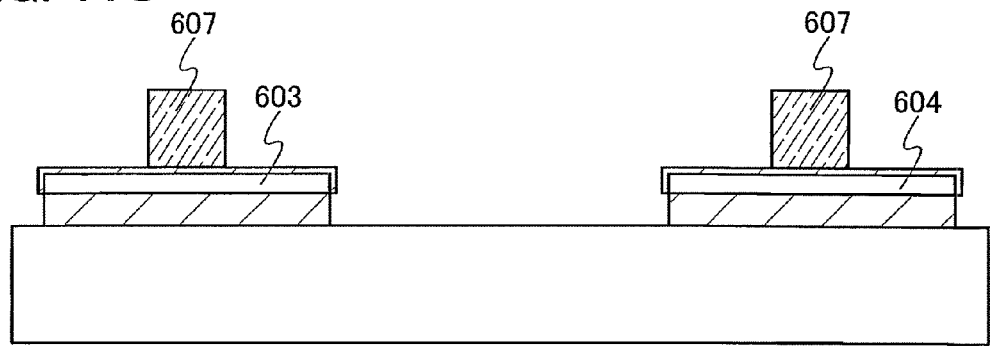

Subsequently, after forming a conductive film over the gate insulating film 606 as shown in FIG. 11C, the conductive film is patterned into a predetermined shape, thereby forming an electrode 607 over each of the island-shaped semiconductor films 603 and 604. The conductive film can be formed by a CVD method, a sputtering method, or the like. The conductive film can be formed of tantalum (Ta), tungsten (W), titanium (Ti), molybdenum (Mo), aluminum (Al), copper (Cu), chromium (Cr), niobium (Nb), or the like. Alternatively, an alloy containing any of the aforementioned metals as its main component or a compound containing any of the aforementioned metals may be used. Further alternatively, semiconductors such as polycrystalline silicon formed by doping a semiconductor film with an impurity element imparting conductivity such as phosphorus may be used.

In a case of forming a two-layer conductive film, the first layer can be formed of tantalum nitride or tantalum (Ta) and the second layer can be formed of tungsten (W). Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment can be performed for thermal activation in a later step after forming the two-layer conductive film. Moreover, as the second layer, for example, silicon doped with an n-type impurity and nickel silicide (NiSi), silicon doped with an n-type impurity and tungsten silicide (WSi$_x$), or the like can be used.

Although the electrode 607 is formed by a single-layer conductive film in this embodiment mode, this embodiment mode is not limited to this structure. The electrode 607 may be formed by stacking plural conductive films. In a case of a three-layer structure formed by stacking three conductive films, a stack structure of a molybdenum film, an aluminum film, and a molybdenum film is preferably used.

A mask used for forming the electrode 607 may be formed of silicon oxide, silicon oxynitride, or the like instead of using a resist. In this case, a step of forming a mask by patterning silicon oxide, silicon oxynitride, or the like is additionally performed; however, the electrode 607 can be formed with a desired width because such a mask does not decrease in film thickness at the time of etching, as compared with a resist mask. Alternatively, the electrode 607 may be formed selectively by a droplet discharging method instead of using a mask.

A droplet discharging method refers to a method of forming a predetermined pattern by discharging or jetting a droplet including a predetermined composition from a small hole and includes an inkjet method or the like in its category.

After forming the conductive film, the conductive film can be etched to form the electrode 607 having a desired tapered shape with the use of an ICP (inductively coupled plasma) etching method by adjusting an etching condition (the amount of electric power applied to a coil-shaped electrode layer, the amount of electric power applied to an electrode layer on a substrate side, the electrode temperature on the substrate side, and the like) as appropriate. The angle and the like of the tapered shape can be controlled also by a mask shape. As a gas used for the etching, a chlorine-based gas such as chlorine, boron chloride, silicon chloride, or carbon tetrachloride; a fluorine-based gas such as carbon tetrafluoride, sulfur tetrafluoride, or nitrogen fluoride; or oxygen can be used as appropriate.

Figure 11D:
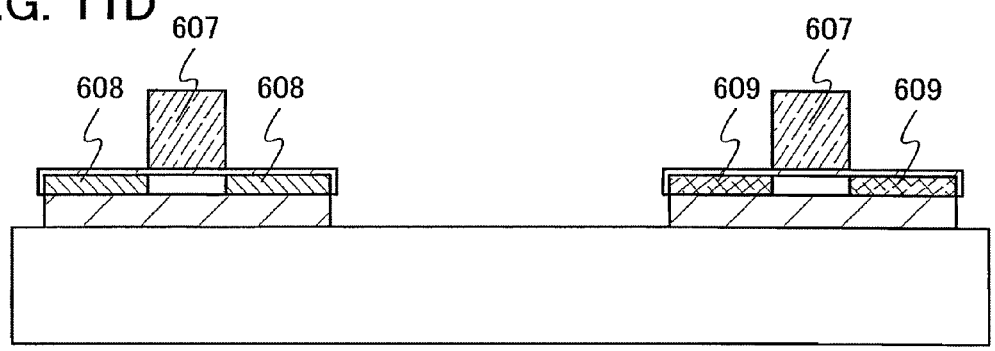

Subsequently, as shown in FIG. 11D, impurity elements imparting one conductivity type are added to the semiconductor films 603 and 604 by using the electrodes 607 as masks. In this embodiment mode, a p-type impurity element (such as boron) is added to the semiconductor film 604 while an n-type impurity element (such as phosphorus or arsenic) is added to the semiconductor film 603. It is to be noted that when the p-type impurity element is added to the semiconductor film 604, the semiconductor film 603 to which the n-type impurity element is added is covered with a mask or the like so that the p-type impurity element is added selectively. On the other hand, when the n-type impurity element is added to the semiconductor film 603, the semiconductor film 604 to which the p-type impurity element is added is covered with a mask or the like, so that the n-type impurity element is added selectively. Alternatively, after adding an impurity element imparting one of p-type and n-type conductivity to the semiconductor films 603 and 604, an impurity element imparting the other conductivity may be added to one of the semiconductor films 603 and 604 selectively at higher concentration than the previously added impurity. By the impurity addition, impurity regions 608 are formed in the semiconductor film 603 and impurity regions 609 are formed in the semiconductor film 604.

Figure 12A:
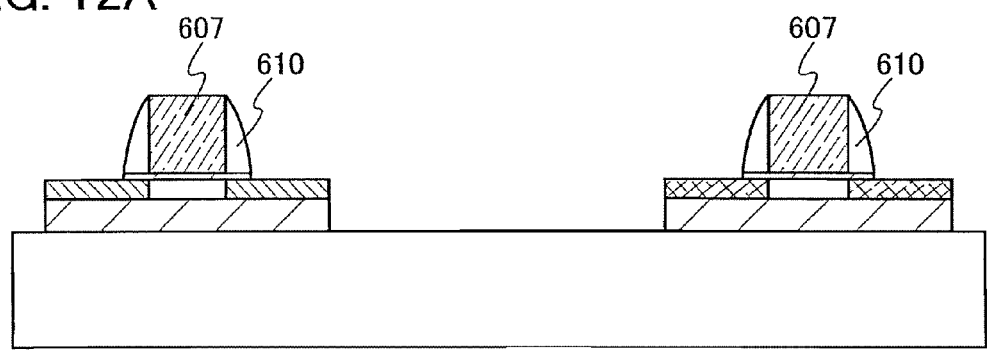
FIGS. 12A to 12C are cross-sectional views showing a method of manufacturing a semiconductor device of the present invention.

Subsequently, as shown in FIG. 12A, sidewalls 610 are formed at side surfaces of the electrodes 607. The sidewalls 610 can be formed by, for example, newly forming an insulating film so as to cover the gate insulating film 606 and the electrodes. 607 and anisotropically etching mainly in a perpendicular direction to partially etch the newly formed insulating film. By the anisotropic etching, the newly formed insulating film is partially etched to form the sidewalls 610 at the side surfaces of the electrodes 607. It is to be noted that the gate insulating film 606 may also be etched partially by the anisotropic etching. The insulating film for forming the sidewalls 610 may be formed as a single layer or a stack of plural layers of a film including an organic material such as an organic resin or a film of silicon, silicon oxide, silicon oxynitride, or silicon nitride oxide by a plasma CVD method, a sputtering method, or the like. In this embodiment mode, a 100-nm-thick silicon oxide film is formed by a plasma CVD method. As the etching gas, a mixed gas of $CHF_3$ and helium can be used. It is to be noted that the step of forming the sidewalls 610 is not limited to this.

Figure 12B:
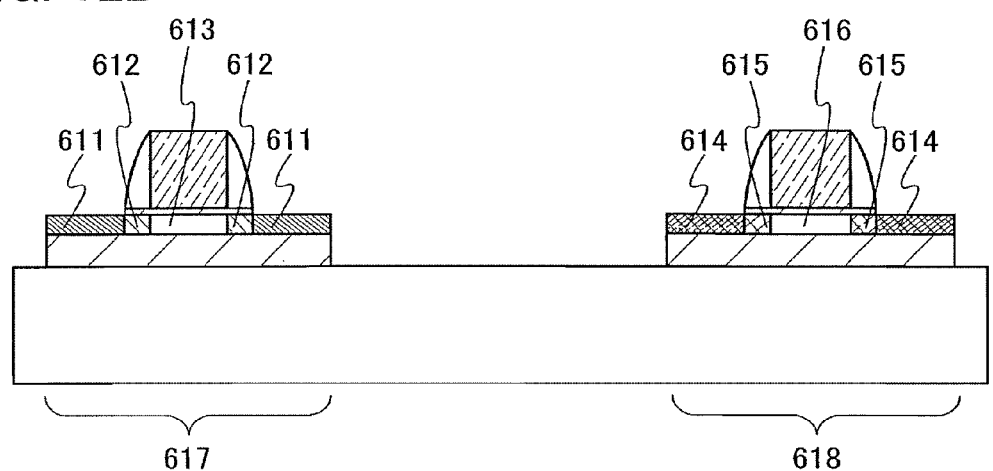

As shown in FIG. 12B, impurity elements imparting one conductivity type are added to the semiconductor films 603 and 604 by using the electrodes 607 and the sidewalls 610 as masks. It is to be noted that the impurity elements imparting the same conductivity type as the impurity elements added in the previous step are added to the semiconductor films 603 and 604 at higher concentration. It is to be noted that when the p-type impurity element is added to the semiconductor film 604, the semiconductor film 603 to which the n-type impurity element is added is covered with a mask or the like so that the p-type impurity element is added selectively. On the other hand, when the n-type impurity element is added to the semiconductor film 603, the semiconductor film 604 to which the p-type impurity element is added is covered with a mask or the like so that the n-type impurity element is added selectively.

By the addition of the impurity elements, a pair of high-concentration impurity regions 611, a pair of low-concentration impurity regions 612, and a channel formation region 613 are formed in the semiconductor film 603. Moreover, by the addition of the impurity elements, a pair of high-concentration impurity regions 614, a pair of low-concentration impurity regions 615, and a channel formation region 616 are formed in the semiconductor film 604. The high-concentration impurity regions 611 and 614 function as source and drain, while the low-concentration impurity regions 612 and 615 function as LDD (lightly doped drain) regions.

It is to be noted that the sidewalls 610 formed over the semiconductor film 604 and the sidewalls 610 formed over the semiconductor film 603 may have the same widths in a carrier moving direction or may have different widths in the carrier moving direction. The width of each of the sidewalls 610 over the semiconductor film 604 which forms a p-type transistor is preferably larger than that over the semiconductor film 603 which forms an n-type transistor. This is because boron, which is added to form a source and a drain in the p-type transistor, easily diffuses to induce a short-channel effect. When the sidewalls 610 of the p-type transistor each have a larger width, boron can be added to the source and the drain at high concentration, whereby the source and the drain can be made to have a lower resistance.

Next, in order to further decrease the resistance of the source and drain, a silicide layer may be formed by siliciding the semiconductor films 603 and 604. The siliciding is performed by placing a metal in contact with the semiconductor films and causing reaction between the metal and silicon in the semiconductor films through heat treatment such as a GRTA method or an LRTA method. The silicide layer may be formed of cobalt silicide or nickel silicide. In a case where the semiconductor films 603 and 604 are thin, the silicide reaction may proceed to the bottom of the semiconductor films 603 and 604 in this region. The metal material used in the siliciding may be titanium (Ti), nickel (Ni), tungsten (W), molybdenum (Mo), cobalt (Co), zirconium (Zr), hafnium (Ha), tantalum (Ta), vanadium (V), neodymium (Nd), chromium (Cr), platinum (Pt), palladium (Pd), or the like. Alternatively, the silicide may be performed by laser irradiation, light irradiation using a lamp, or the like.

Through the aforementioned steps, an n-channel transistor 617 and a p-channel transistor 618 are formed.

Figure 12C:
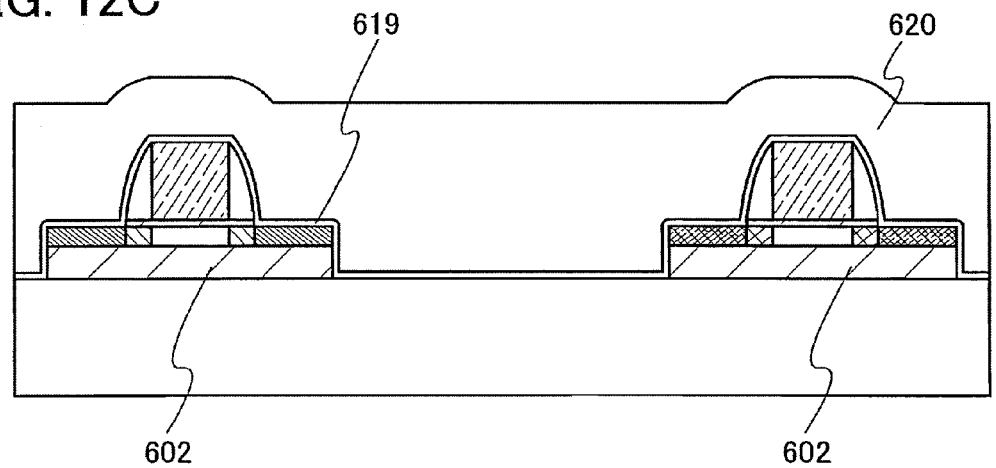

Next, an insulating film 619 is formed so as to cover the transistors 617 and 618, as shown in FIG. 12C. The insulating film 619 is not always necessary; however, the formation of the insulating film 619 can prevent impurities such as an alkali metal and an alkaline earth metal from entering the transistors 617 and 618. In specific, the insulating film 619 is desirably formed of silicon nitride, silicon nitride oxide, silicon oxynitride, aluminum nitride, aluminum oxide, silicon oxide, or the like. In this embodiment mode, the insulating film 619 is formed by a silicon oxynitride film with a thickness of about 600 nm. In this case, the hydrogenation treatment may be performed after forming the silicon oxynitride film.

Subsequently, an insulating film 620 is formed over the insulating film 619 so as to cover the transistors 617 and 618. The insulating film 620 can be formed of a heat-resistant organic material such as polyimide, acrylic, benzocyclobutene, polyamide, or epoxy. As an alternative to the above organic material, a material with a low dielectric constant (a low-k material), a siloxane-based resin, silicon oxide, silicon nitride, silicon oxynitride, silicon nitride oxide, PSG (phosphosilicate glass), BPSG (borophosphosilicate glass), alumina, or the like can be used. A siloxane-based resin may have, as its substituent, at least one of fluorine, an alkyl group, and an aromatic hydrocarbon in addition to hydrogen. Alternatively, the insulating film 620 may be formed by stacking plural insulating films formed of these materials. The insulating film 620 may have its surface flattened by a CMP method, liquid jet polishing, or the like.

In a case where the island-shaped semiconductor film 603 and the island-shaped semiconductor film 604 are formed by semiconductor films obtained by different steps, the insulating film 602 is isolated between the island-shaped semiconductor film 603 and the island-shaped semiconductor film 604 as shown in FIG. 12C in some cases, depending on the manufacturing method. However, when the insulating film 620 is formed by a coating method with the use of, for example, the aforementioned polyimide, siloxane-based resin, or the like, it is possible to prevent the surface of the insulating film 620 from losing its flatness due to a dent between the insulating films 602. Therefore, it is possible to prevent conductive films 621 and conductive films 622 which are later formed over the insulating film 620 from being drastically thinned partially or, in the worst case, being disconnected due to an uneven surface of the insulating film 620 caused by the difference in height between the insulating films 602 and the base substrate 601. Accordingly, the formation of the insulating film 620 by a coating method can increase the yield and reliability of the semiconductor device formed as a result, by applying the present invention.

The siloxane-based resin corresponds to a resin including a Si—O—Si bond formed by starting from a siloxane-based material. The siloxane-based resin may have, as its substituent, at least one of fluorine, an alkyl group, and an aromatic hydrocarbon in addition to hydrogen.

The insulating film 620 can be formed by a CVD method, a sputtering method, an SOG method, spin coating, dipping, spray coating, a droplet discharging method (an inkjet method, screen printing, offset printing, or the like), a doctor knife, a roll coater, a curtain coater, a knife coater, or the like depending on the material.

Figure 13:
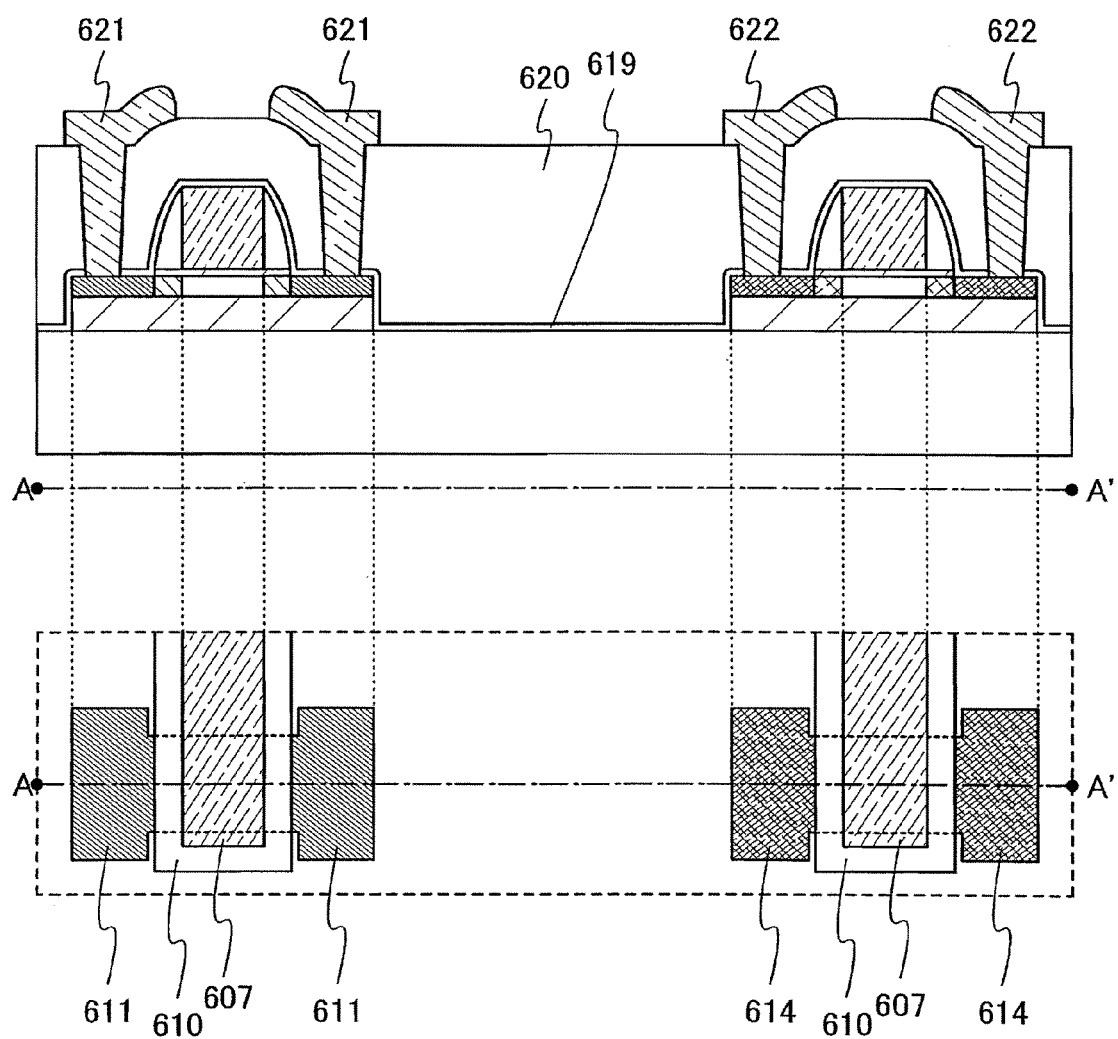
FIG. 13 is a cross-sectional view showing a method of manufacturing a semiconductor device of the present invention.

Subsequently, as shown in FIG. 13, contact holes are formed in the insulating film 619 and the insulating film 620 so as to partially expose the island-shaped semiconductor films 603 and 604. Then, the conductive films 621 and 622 are formed in contact with the island-shaped semiconductor films 603 and 604 through the contact holes. The contact holes are formed by etching with the use of a mixed gas of $CHF_3$ and He; however, the present invention is not limited to this.

The conductive films 621 and 622 can be formed by a CVD method, a sputtering method, or the like. In specific, the conductive films 621 and 622 can be formed of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing any of the aforementioned metals as its main component or a compound containing any of the aforementioned metals may be used. The conductive films 621 and 622 can be formed as a single layer or a stack of plural layers by using a film formed of any of the aforementioned metals.

As an example of an alloy containing aluminum as its main component, an alloy containing aluminum as its main component and also containing nickel is given. Moreover, an alloy containing aluminum as its main component and also containing nickel and one of or both carbon and silicon can be given as another example. Since aluminum and aluminum silicon have low resistance and are inexpensive, they are suitable for forming the conductive films 621 and 622. In comparison to an aluminum film, an aluminum silicon (Al—Si) film can particularly prevent the generation of hillock at resist baking at the time of patterning the conductive films 621 and 622. The aluminum film may include about 0.5 wt. % of copper instead of including silicon.

Each of the conductive films 621 and 622 preferably employs a stacked layer structure of a barrier film, an aluminum silicon (Al—Si) film, and a barrier film, or a stacked layer structure of a barrier film, an aluminum silicon (Al—Si) film, a titanium nitride film, and a barrier film. The barrier film is formed of titanium, titanium nitride, molybdenum, or molybdenum nitride. With the provision of the aluminum silicon (Al—Si) film between the barrier films, the generation of hillock of aluminum or aluminum silicon can be prevented further. Even if a thin oxide film is formed over the island-shaped semiconductor films 603 and 604, the formation of the barrier films by using titanium, which is an element with a high reduction property, allows titanium in the barrier films to reduce this oxide film. As a result, the conductive films 621 and 622 can have favorable contact with the island-shaped semiconductor films 603 and 604. The barrier films may each be formed by stacking plural layers. In that case, for example, each of the conductive films 621 and 622 can be formed to have a five-layer structure of titanium, titanium nitride, aluminum silicon, titanium, and titanium nitride in order from the bottom.

It is to be noted that the conductive films 621 are connected to the high-concentration impurity regions 611 of the n-channel transistor 617. The conductive films 622 are connected to the high-concentration impurity regions 614 of the p-channel transistor 618.

FIG. 13 includes a top view of the n-channel transistor 617 and the p-channel transistor 618. However, the conductive films 621 and 622, the insulating film 619, and the insulating film 620 are omitted in FIG. 13.

Although this embodiment mode shows the case where each of the n-channel transistor 617 and the p-channel transistor 618 has one electrode 607 serving as a gate, the present invention is not limited to this structure. The transistors manufactured in accordance with the present invention may each have a multigate structure having plural electrodes which function as gates and which are electrically connected to each other.

The transistors in the semiconductor device manufactured by the present invention may have a gate-planar structure.

This embodiment mode can be implemented in combination with the above embodiment mode as appropriate.

Embodiment 1

This embodiment describes the procedure of forming a semiconductor display device as one semiconductor device, by forming semiconductor films over one base substrate in a plurality of steps.

Figure 14A:
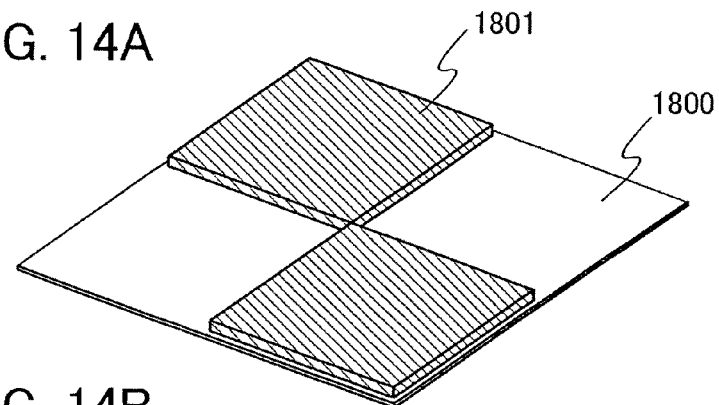
FIGS. 14A to 14D are perspective views showing a method of manufacturing a semiconductor device of the present invention.

As shown in FIG. 14A, a plurality of bonding substrates 1801 is attached to a base substrate 1800 by bonding. Each of the bonding substrates 1801 has a plurality of projections, and is attached to the base substrate 1800 so that the projections face the base substrate 1800.

Figure 14B:
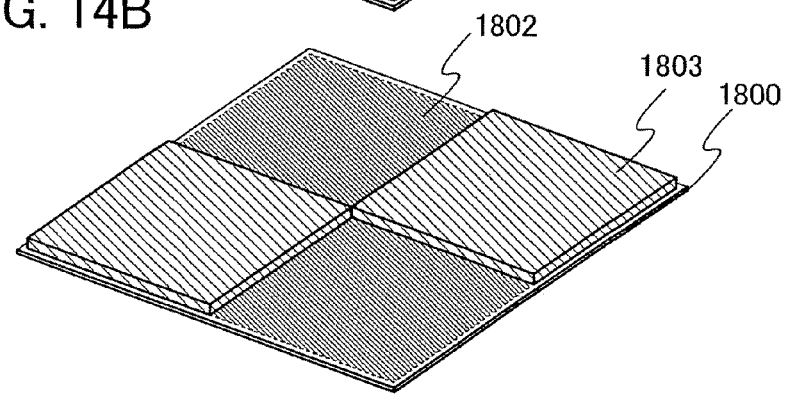

Next, semiconductor films 1802 are formed over the base substrate 1800 by cleaving or separating the bonding substrates 1801 at the projections, as shown in FIG. 14B. Then, bonding substrates 1803 are attached to the base substrate 1800 by bonding. Each of the bonding substrates 1803 has a plurality of projections, and is attached to the base substrate 1800 so that the projections face the base substrate 1800.

Figure 14C:
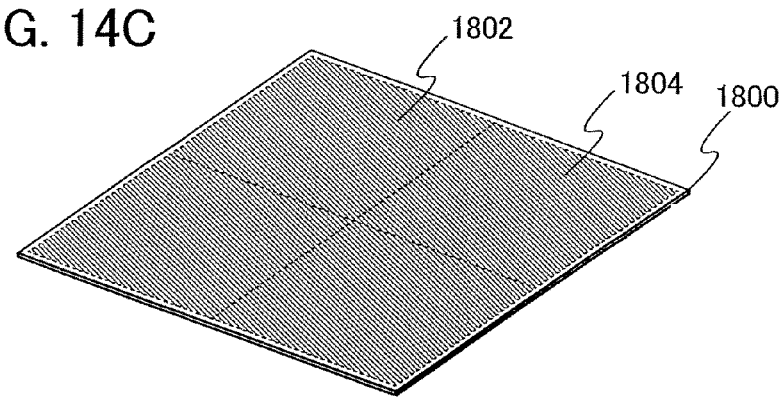

Subsequently, semiconductor films 1804 are formed over the base substrate 1800 by cleaving or separating the bonding substrate 1803 at the projections, as shown in FIG. 14C.

Figure 14D:
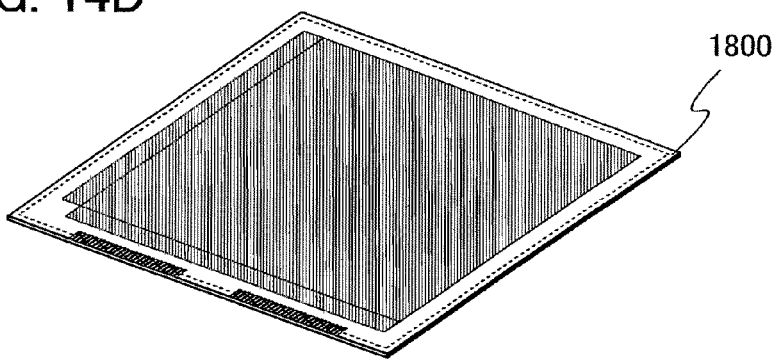

Then, by forming semiconductor elements with the use of the semiconductor films 1802 and the semiconductor films 1804 formed over the base substrate 1800, an element substrate for a semiconductor display device as shown in FIG. 14D can be formed. It is to be noted that the element substrate corresponds to a substrate where semiconductor elements for controlling driving of pixels are formed. A display element for displaying grayscales may be formed between an element substrate and a counter substrate like a liquid crystal cell, or may be formed on an element substrate side like a light-emitting element. The element substrate is also included in the category of the semiconductor device of the present invention.

In the present invention, the distance between the semiconductor films 1802 formed first and the semiconductor films 1804 formed later can be shortened to be as small as several tens micrometers, and a semiconductor device can be manufactured using the semiconductor films 1802 and 1804 without the influence of the space between the semiconductor films 1802 and 1804.

Figure 15A:
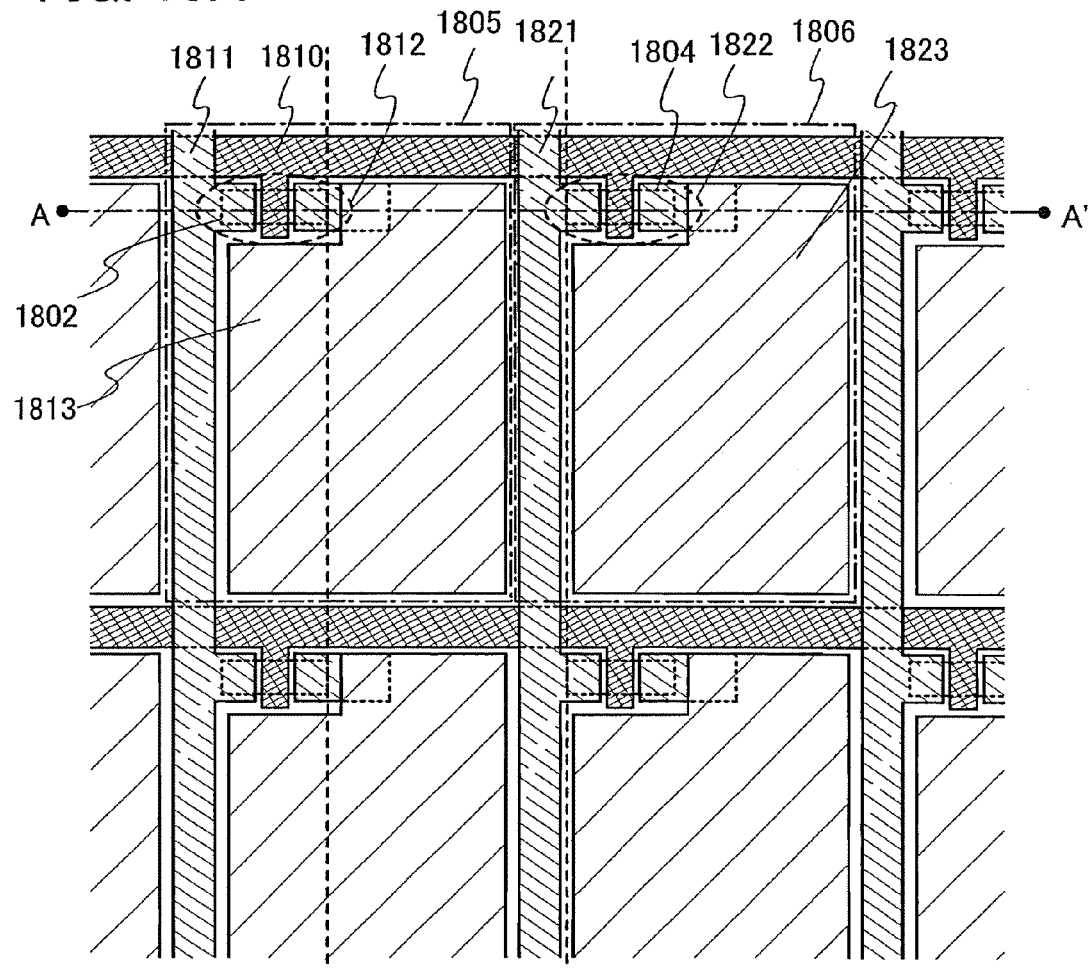
FIG. 15A is a top view and FIG. 15B is a cross-sectional view, each showing a pixel of a semiconductor display device manufactured in accordance with the present invention.
Figure 15B:
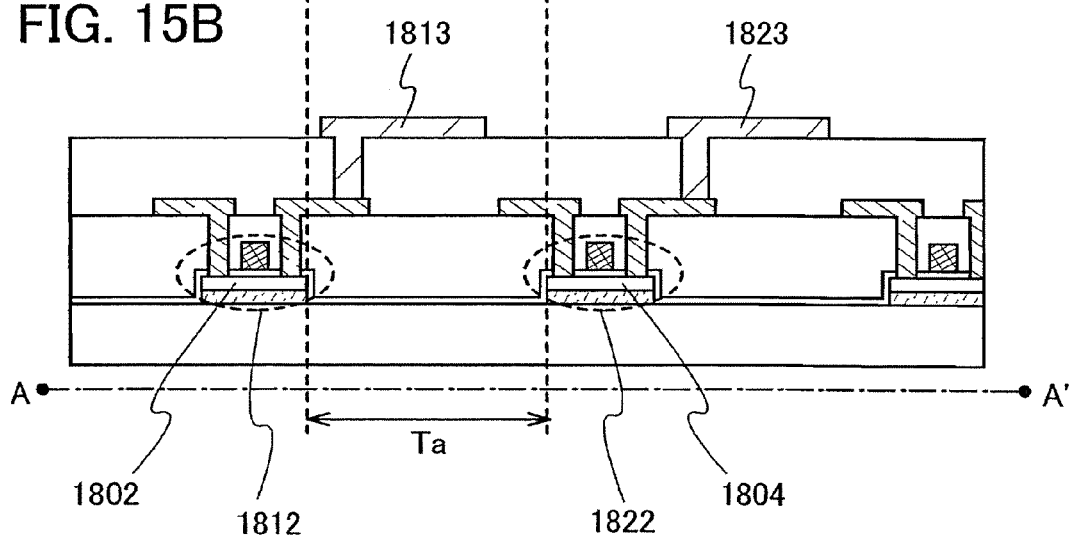

FIG. 15A shows an example of a magnified view of pixels of a liquid crystal display device which are manufactured using the semiconductor films 1802 and 1804 without the influence of the space between the semiconductor films 1802 and 1804. FIG. 15A is a top view of a pixel 1806 adjacent to a pixel 1805, and FIG. 15B corresponds to a cross-sectional view along a dotted line A-A' of the top view shown in FIG. 15A.

The pixel 1805 includes at least a scanning line 1810, a signal line 1811, a transistor 1812 functioning as a switching element, and a pixel electrode 1813. The pixel 1806 includes at least the scanning line 1810, a signal line 1821, a transistor 1822 functioning as a switching element, and a pixel electrode 1823.

The transistor 1812 in the pixel 1805 has the semiconductor film 1802, and the transistor 1822 in the pixel 1806 has the semiconductor film 1804. In the present invention, the distance Ta between the semiconductor film 1802 and the semiconductor film 1804 can be shortened to be as small as several tens micrometers, and a semiconductor device can be manufactured using the semiconductor films 1802 and 1804 without the influence of the space between the semiconductor films 1802 and 1804.

This embodiment mode can be implemented in combination with the above embodiment mode as appropriate.

Embodiment 2

This embodiment describes a structure of an active matrix semiconductor display device, which is one of semiconductor devices manufactured by the present invention.

An active matrix light-emitting device has pixels each provided with a light-emitting element corresponding to a display element. Since a light-emitting element emits light by itself, there are advantages in that the visibility is high, a backlight necessary for a liquid crystal display device is not needed, which is suitable for thinning, and moreover the viewing angle is not restricted. Although this embodiment describes a light-emitting device using an organic light-emitting diode (an OLED) as one of light-emitting elements, the semiconductor display device manufactured by the present invention may be a light-emitting device using any other light-emitting element.

An OLED includes an anode layer, a cathode layer, and a layer including a material from which luminescence (electroluminescence) is obtained by applying an electric field. As electroluminescence, there are luminescence (fluorescence) at the time of returning from a singlet-excited state to a ground state and luminescence (phosphorescence) at the time of returning from a triplet-excited state to a ground state. In a light-emitting device of the present invention, one of or both fluorescence and phosphorescence may be used.

Figure 16A:
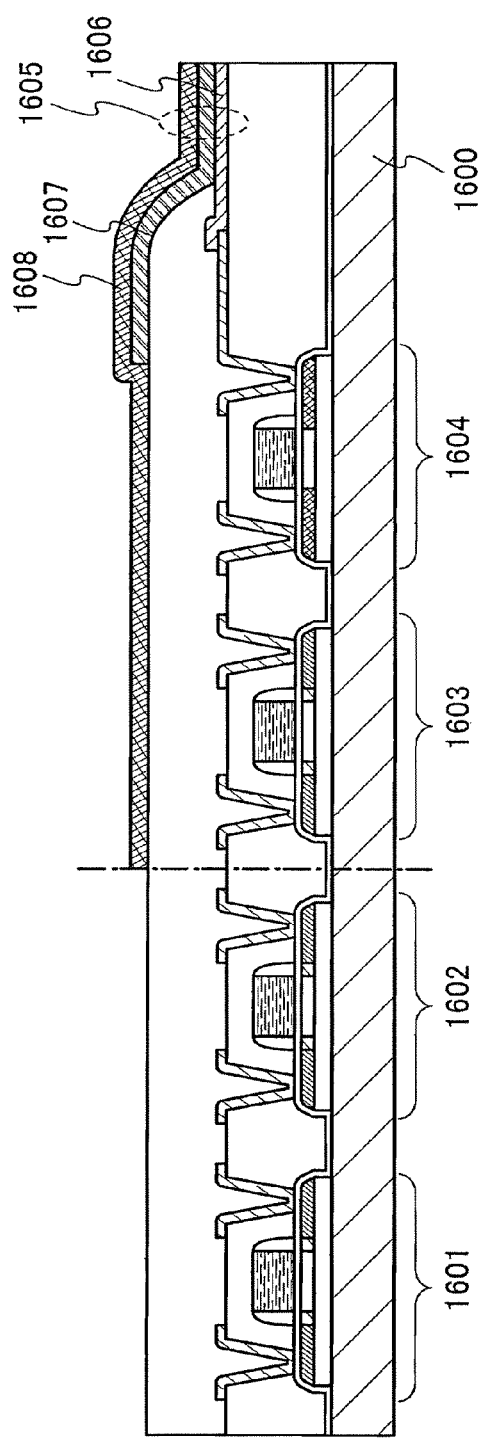
FIGS. 16A and 16B are cross-sectional views each showing a pixel of a semiconductor display device manufactured in accordance with the present invention.

FIG. 16A is a cross-sectional view of a light-emitting device of this embodiment. The light-emitting device shown in FIG. 16A has a transistor 1601 and a transistor 1602 which are used for a driver circuit, a driver transistor 1604 which is used for a pixel, and a switching transistor 1603 over an element substrate 1600. The light-emitting device shown in FIG. 16A has a light-emitting element 1605 in a pixel over the element substrate 1600.

The light-emitting element 1605 has a pixel electrode 1606, an electroluminescent layer 1607, and a counter electrode 1608. One of the pixel electrode 1606 and the counter electrode 1608 is an anode, and the other is a cathode.

The anode can be formed of a light-transmitting conductive oxide such as indium tin oxide including silicon oxide (ITSO), indium tin oxide (ITO), zinc oxide (ZnO), indium zinc oxide (IZO), or gallium-doped zinc oxide (GZO). As an alternative to the light-transmitting conductive oxide, the anode can be formed, for example, as a single-layer film including one or more of titanium nitride, zirconium nitride, Ti, W, Ni, Pt, Cr, Ag, Al, and the like, as a stack of a titanium nitride film and a film containing aluminum as its main component, as a three-layer film of a titanium nitride film, a film containing aluminum as its main component, and a titanium nitride film, or the like. In a case where the anode is formed of a material other than the light-transmitting conductive oxide and light is extracted from the anode side, the anode is formed to a thickness such that light transmits therethrough (preferably about 5 nm to 30 nm).

It is to be noted that the anode can be formed of a conductive composition including a conductive macromolecule (also referred to as a conductive polymer). The conductive composition preferably has a sheet resistance of 10000 Ω/square or less and a light transmittance of 70% or more at a wavelength of 550 nm when the conductive composition is formed into a conductive film serving as an anode. Moreover, the conductive macromolecule included in the conductive composition preferably has a resistivity of 0.1 Ω·cm or less.

The conductive macromolecule may be a so-called π-electron conjugated conductive macromolecule. For example, polyaniline and/or a derivative thereof, polypyrrole and/or a derivative thereof, polythiophene and/or a derivative thereof, and a copolymer of plural kinds of those materials can be given as the π-electron conjugated conductive macromolecule.

As specific examples of a conjugated conductive polymer, the following can be given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The aforementioned conductive macromolecule may be used alone as the conductive composition for the anode. Alternatively, in order to adjust the film characteristics such as the uniformity of the film thickness of the conductive composition and the film strength thereof, an organic resin may be added to the aforementioned conductive macromolecule.

As for the organic resin, a thermosetting resin, a thermoplastic resin, or a photocurable resin may be used as long as the resin is compatible to a conductive macromolecule or the resin can be mixed and dispersed into a conductive macromolecule. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins can be used.

Further, in order to adjust the electrical conductivity of the conductive composition, the conductive composition may be doped with an acceptor dopant or a donor dopant to change the oxidation-reduction potential of a conjugated electron in the conjugated conductive macromolecule.

As the acceptor dopant, a halogen compound, Lewis acid, proton acid, an organic cyano compound, an organometallic compound, or the like can be used. As examples of the halogen compound, chlorine, bromine, iodine; iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sulfonic acid compounds can be used. As the organic cyano compound, a compound having a plurality of cyano groups in a conjugated bonding, for example, tetracyanoethylene, tetracyanoethylene oxide, tetracyanobenzene, tetracyanoquinodimethane, tetracyanoazanaphthalene, and the like are given.

As the donor dopant, there are an alkali metal, an alkaline-earth metal, a quaternary amine compound, and the like.

Alternatively, a conductive composition is dissolved in water or an organic solvent (e.g., an alcohol-based solvent, a ketone-based solvent, an ester-based solvent, a hydrocarbon-based solvent, or an aromatic-based solvent) and a wet process is used, whereby a thin film which serves as the anode can be formed.

There is no particular limitation on the solvent in which the conductive high molecule or the conductive composition is dissolved as long as the above-described conductive macromolecule and the macromolecular resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and/or the like.

After the conductive composition is dissolved in the solvent as described above, a film thereof can be formed by a wet process, such as a coating method, a droplet discharging method (also referred to as an inkjet method), or a printing method. The solvent may dried with heat treatment or may be dried under reduced pressure. In the case where the organic resin is a thermosetting resin, heat treatment may be performed further. In the case where the organic resin is a photocurable resin, light irradiation treatment may be performed.

The cathode can be formed in general by using a metal, an alloy, an electrically conductive compound, or a mixture thereof, each of which has a low work function. Specifically, a rare-earth metal such as Yb or Er as well as an alkali metal such as Li or Cs, an alkaline-earth metal such as Mg, Ca, or Sr, or an alloy containing these (Mg:Ag, Al:Li, or the like) can be used. When a layer containing a material having a high electron-injecting property is formed in contact with the cathode, a general conductive film of aluminum, a light-transmitting conductive oxide material, or the like can be used.

The electroluminescent layer 1607 may be formed as a single layer or a stack of plural layers, each layer of which may include an inorganic material in addition to the organic material. The luminescence of the electroluminescent layer 1607 includes luminescence (fluorescence) at the time of returning from a singlet-excited state to a ground state and luminescence (phosphorescence) at the time of returning from a triplet-excited state to a ground state. When the electroluminescent layer 1607 is formed to have a plurality of layers and the pixel electrode 1606 is the cathode, the electroluminescent layer 1607 is formed by stacking an electron-injecting layer, an electron-transporting layer, a light-emitting layer, a hole-transporting layer, and a hole-injecting layer in order over the pixel electrode 1606. When the pixel electrode 1606 corresponds to the anode, the electroluminescent layer 1607 is formed by stacking a hole-injecting layer, a hole-transporting layer, a light-emitting layer, an electron-transporting layer, and an electron-injecting layer in order.

The electroluminescent layer 1607 can be formed by a droplet discharging method using any of a macromolecular organic compound, an intermolecular organic compound (which does not have a subliming property but has a molecular chain length of 10 μm or less), a low molecular organic compound, and an inorganic compound. In a case of using an intermolecular organic compound, a low molecular organic compound, or an inorganic compound, the electroluminescent layer 1607 may be formed by an evaporation method.

The switching transistor 1603 and the driver transistor 1604 may each have a multigate structure such as a double gate structure or a triplet gate structure instead of having a single gate structure.

Figure 16B:
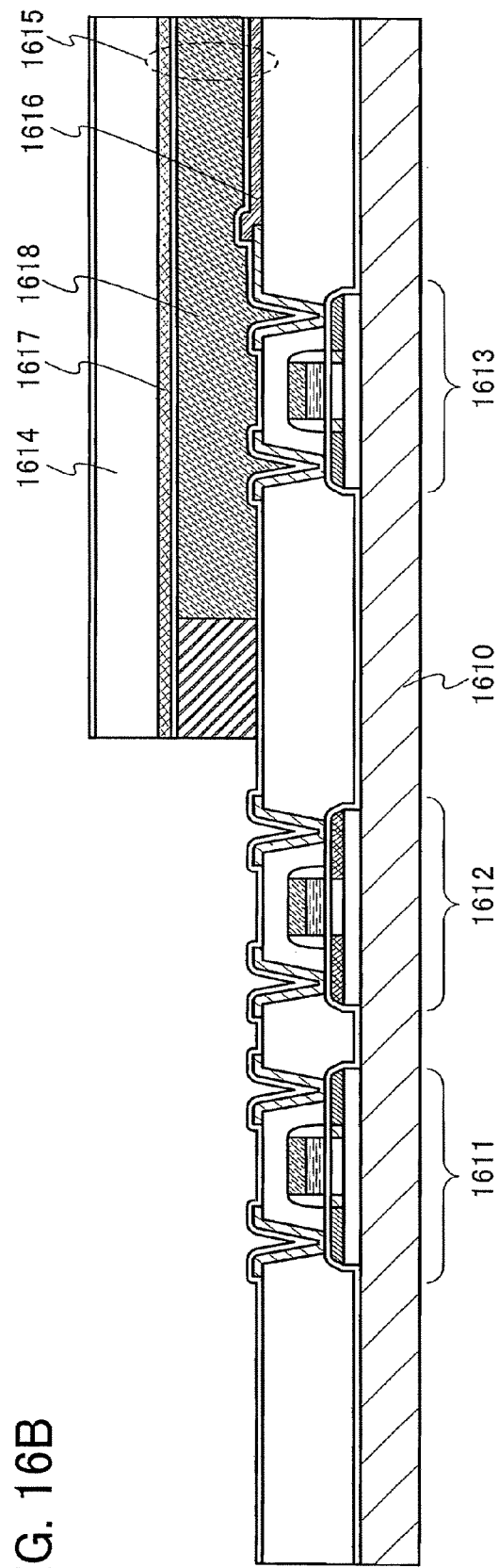

Subsequently, FIG. 16B is a cross-sectional view of a liquid crystal display device of this embodiment. The liquid crystal display device shown in FIG. 16B has a transistor 1611 and a transistor 1612 which are used for a driver circuit, and a transistor 1613 which is used as a switching element in a pixel over an element substrate 1610. The liquid crystal display device shown in FIG. 16B has a liquid crystal cell 1615 between the element substrate 1610 and a counter substrate 1614.

The liquid crystal cell 1615 has a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed of, for example, indium tin oxide including silicon oxide (ITSO), indium tin oxide (ITO), zinc oxide (ZnO), indium zinc oxide (IZO), gallium-doped zinc oxide (GZO), or the like.

This embodiment mode can be implemented in combination with the above embodiment mode or embodiment as appropriate.

Embodiment 3

Figure 17:
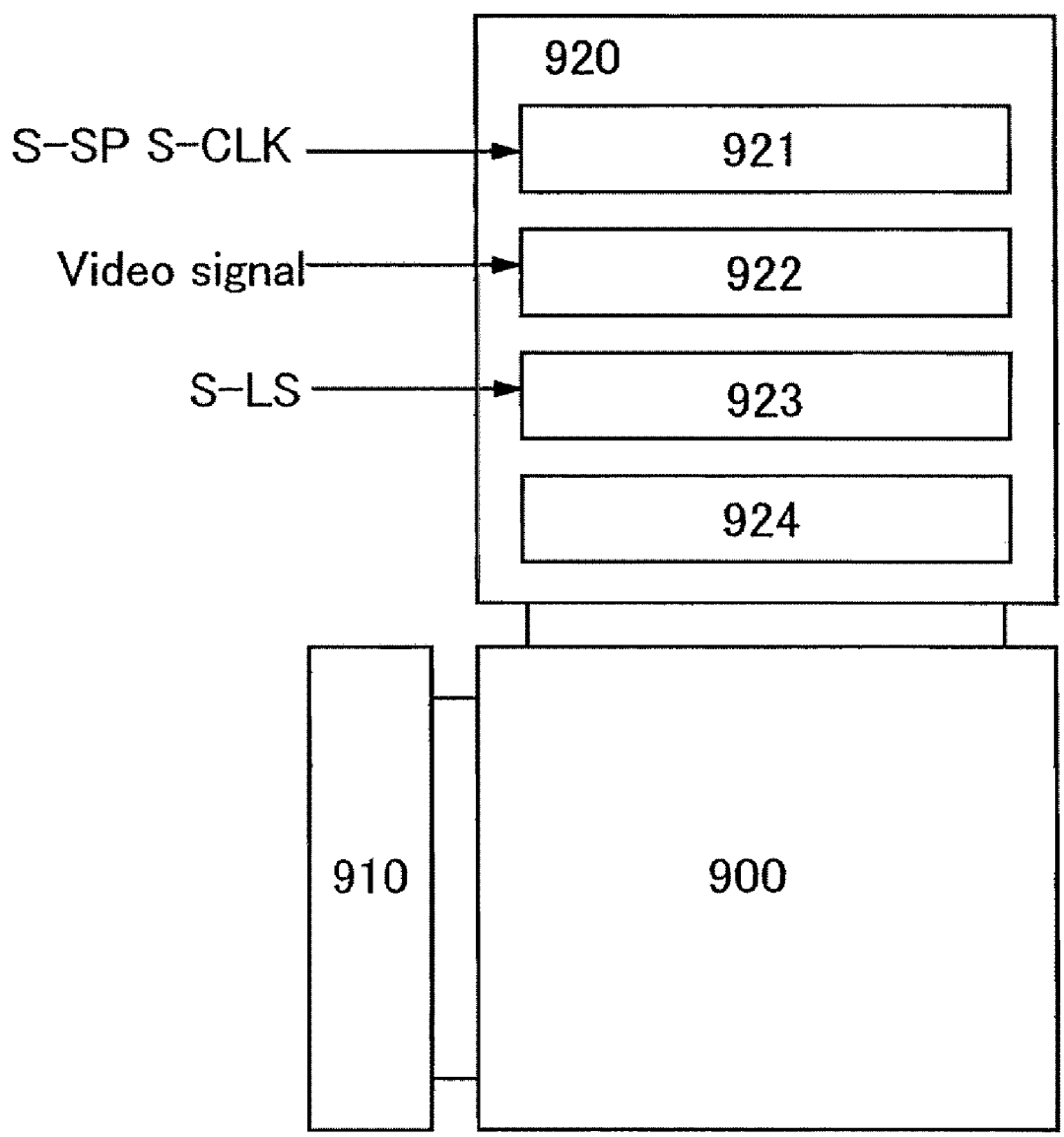
FIG. 17 is a block diagram showing a structure of a semiconductor display device manufactured in accordance with the present invention.

This embodiment describes an overall structure of a semiconductor display device manufactured by the present invention. FIG. 17 is a block diagram of a semiconductor display device manufactured by the present invention, as an example.

The semiconductor display device shown in FIG. 17 has a pixel portion 900 including a plurality of pixels, a scanning line driving circuit 910 which selects pixels for each line, and a signal line driving circuit 920 which controls the input of a video signal to the pixels at the selected line.

The signal line driving circuit 920 in FIG. 17 has a shift register 921, a first latch 922, a second latch 923, and a D/A (digital to analog) converting circuit 924. A clock signal S-CLK and a start pulse signal S-SP are input to the shift register 921. The shift register 921 generates a timing signal of which pulse sequentially shifts in accordance with the clock signal S-CLK and the start pulse signal S-SP and outputs the timing signal to the first latch 922. The order of pulses of the timing signal may be switched following a signal for switching a scanning direction.

Upon the input of the timing signals to the first latch 922, video signals are sequentially written into and held in the first latch 922 in accordance with pulses of the timing signals. The video signals may be sequentially written in a plurality of memory circuits in the first latch 922; alternatively, the memory circuits in the first latch 922 may be divided into some groups, and the video signals may be input to the memory circuits group by group in parallel, that is, so-called division driving may be performed. Note that the number of groups at this time is called a division number. For example, in a case where a latch is divided into groups such that each group has four memory circuits, division driving is performed with four divisions.

The time until video signal writing into all of the memory circuits of the first latch 922 is completed is called a line period. In practice, a line period may include a horizontal retrace line period.

When one line period is completed, the video signals held in the first latch 922 are written into the second latch 923 all at once and held in accordance with a pulse of a latch signal S-LS which is input to the second latch 923. The next video signals are sequentially written into the first latch 922 which has finished sending the video signals to the second latch 923, in accordance with timing signals from the shift register 921 again. During this second round of the one line period, the video signals written into and held in the second latch 923 are input to the D/A converting circuit 924.

Next, the D/A converting circuit 924 converts the input digital video signals into analog video signals, which are then input to each pixel in the pixel portion 900 through signal lines.

Note that in the signal line driving circuit 920, a circuit which can output signals, pulses of which sequentially shift, may be used instead of the shift register 921.

Note that although the pixel portion 900 is directly connected to the next stage of the D/A converting circuit 924 in FIG. 17, the present invention is not limited to this structure. A circuit which processes the video signal output from the D/A converting circuit 924 can be provided in the previous stage of the pixel portion 900. Examples of the circuit which processes signals include a buffer which can shape a waveform and the like.

Next, an operation of the scanning line driving circuit 910 is explained. In the semiconductor display device manufactured by the present invention, each pixel in the pixel portion 900 is provided with a plurality of scanning lines. The scanning line driving circuit 910 generates a selection signal, inputs the selection signal to each of the scanning lines, and thus selects pixels for each line. When the pixels are selected by the selection signal, transistors of which gates are connected to one scanning line are turned on; thus, the video signals are input to the pixels.

In the present invention, since the distance between the semiconductor films can be shortened, all of the pixel portion 900, the scanning line driving circuit 910, and the signal line driving circuit 920 can be formed over one base substrate.

This embodiment mode can be implemented in combination with the above embodiment mode or embodiment as appropriate.

Embodiment 4

This embodiment describes the external appearance of a semiconductor display device manufactured by the present invention, with reference to FIGS. 18A and 18B. FIG. 18A is a top view of a panel in which transistors and light-emitting elements formed over a base substrate are sealed by a sealant between the base substrate and a sealing substrate, and FIG. 18B corresponds to a cross-sectional view along A-A' of FIG. 18A.

A sealant 4020 is provided so as to surround a pixel portion 4002, a signal line driving circuit 4003, and a scanning line driving circuit 4004 which are formed over a base substrate 4001. A sealing substrate 4006 is provided over the pixel portion 4002, the signal line driving circuit 4003, and the scanning line driving circuit 4004. Therefore, the pixel portion 4002, the signal line driving circuit 4003, and the scanning line driving circuit 4004 are sealed between the base substrate 4001 and the sealing substrate 4006 together with a filler 4007 by the sealant 4020.

Each of the pixel portion 4002, the signal line driving circuit 4003, and the scanning line driving circuit 4004 formed over the base substrate 4001 has a plurality of transistors. FIG. 18B shows, as an example, a transistor 4008 in the signal line driving circuit 4003, and a driver transistor 4009 and a switching transistor 4010 in the pixel portion 4002.

A light-emitting element 4011 uses, as its pixel electrode, a part of a wiring 4017 connected to a source region or a drain region of the driver transistor 4009. The light-emitting element 4011 has a counter electrode 4012 and an electroluminescent layer 4013 in addition to the pixel electrode. The structure of the light-emitting element 4011 is not limited to the structure shown in this embodiment. The structure of the light-emitting element 4011 can be changed as appropriate in accordance with a direction in which light is extracted from the light-emitting element 4011, the polarity of the driver transistor 4009, and the like.

A variety of signals and voltages are supplied to the signal line driving circuit 4003, the scanning line driving circuit 4004, or the pixel portion 4002 from a connection terminal 4016 through lead wirings 4014 and 4015, although not shown in the cross-sectional view of FIG. 18B.

In this embodiment, the connection terminal 4016 is formed using the same conductive film as the counter electrode 4012 included in the light-emitting element 4011. The lead wiring 4014 is formed using the same conductive film as the wiring 4017. The lead wiring 4015 is formed using the same conductive film as gate electrodes included in the driver transistor 4009, the switching transistor 4010, and the transistor 4008.

The connection terminal 4016 is electrically connected to a terminal of an FPC 4018 via an anisotropic conductive film 4019.

Note that the sealing substrate 4006 may be formed of glass, metal (typically, stainless steel), ceramics, plastics, or the like. However, the sealing substrate 4006 which is located on a side from which light of the light emitting element 4011 is extracted needs to have a light-transmitting property. Thus, a light-transmitting material such as a glass plate, a plastic plate, a polyester film, or an acrylic film is preferably used for the sealing substrate 4006.

In addition, an ultraviolet curable resin or a thermosetting resin can be used for the filler 4007 as well as inert gas such as nitrogen or argon. In this embodiment, an example in which nitrogen is used as the filler 4007 is described.

This embodiment mode can be implemented in combination with the above embodiment mode or embodiment as appropriate.

Embodiment 5

Semiconductor display devices that are larger in screen size can be manufactured at low cost by the present invention. Accordingly, the semiconductor display device manufactured by the present invention is preferably used for display devices, laptop personal computers, or image playback devices provided with recording media (typically, a device which plays back a recording medium such as a DVD (a digital versatile disc) and which can display the image). Moreover, the semiconductor device manufactured by the present invention can be applied to other electronic appliances such as cellular phones, portable game machines, electronic book readers, cameras such as video cameras or digital still cameras, goggle type displays (head mount displays), navigation systems, or sound playback devices (such as a car audio system and an audio system). Specific examples of these electronic appliances are shown in FIGS. 19A to 19C.

Figure 19A:
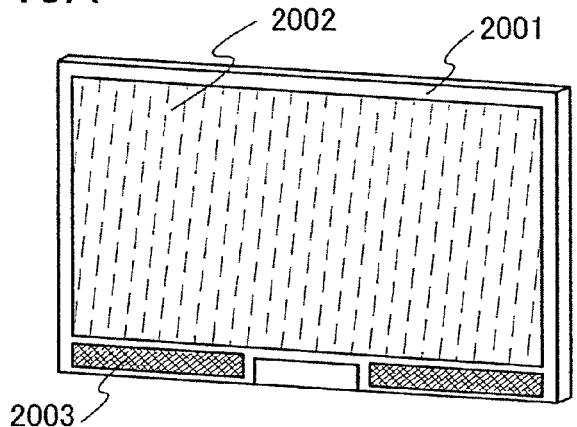
FIGS. 19A to 19C show electronic appliances each using a semiconductor device manufactured in accordance with the present invention.

FIG. 19A shows a display device including a housing 2001, a display portion 2002, speaker portions 2003, and the like. The semiconductor display device manufactured by the present invention can be used for the display portion 2002. Note that the display device includes all of information display devices for personal computers, TV receivers, advertisement displays, and the like. Alternatively, the semiconductor device manufactured by the present invention may be used for a signal processing circuit.

Figure 19B:
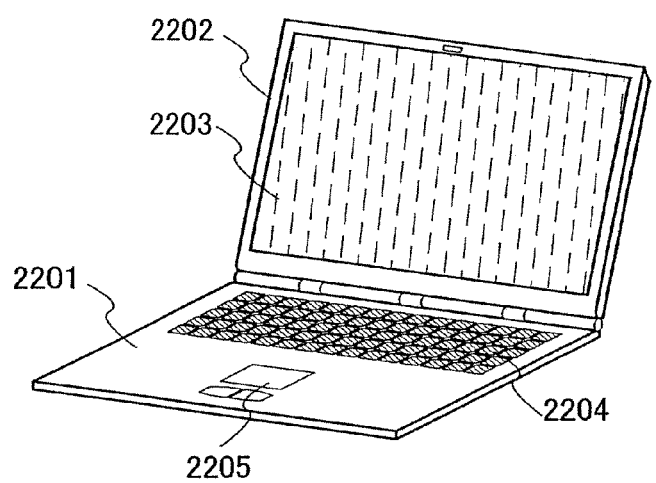

FIG. 19B shows a laptop personal computer including a main body 2201, a housing 2202, a display portion 2203, a keyboard 2204, a pointing device 2205, and the like. The semiconductor display device manufactured by the present invention can be used for the display portion 2203. Alternatively, the semiconductor device manufactured by the present invention may be used for a signal processing circuit.

Figure 19C:
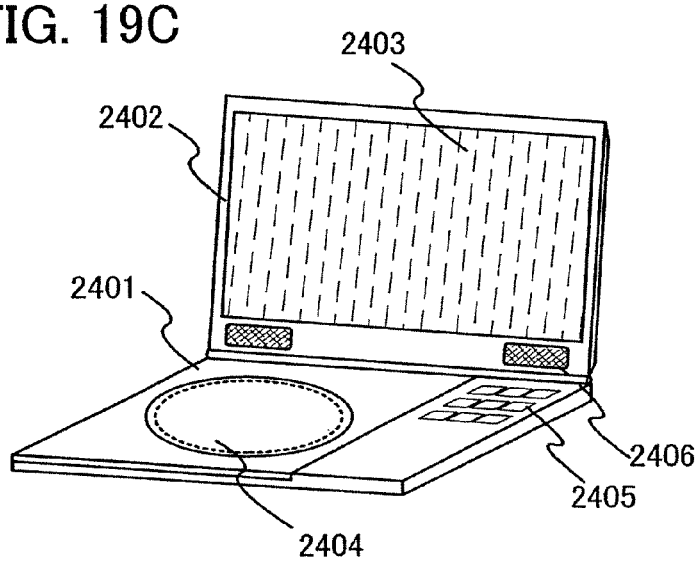

FIG. 19C shows a mobile image playback device provided with a recording medium (specifically a DVD player), which includes a main body 2401, a housing 2402, a display portion 2403, a recording medium (DVD or the like) reading portion 2404, operation keys 2405, speaker portions 2406. The image playback device provided with a recording medium includes a home-use game console. The semiconductor display device manufactured by the present invention can be used for the display portion 2403. Alternatively, the semiconductor device manufactured by the present invention may be used for a signal processing circuit.

As thus described, the present invention can be applied to a wide range, and can be used for electronic appliances of every field.

This embodiment mode can be implemented in combination with the above embodiment mode or embodiment as appropriate.

This application is based on Japanese Patent Application serial no. 2007-179241 filed with Japan Patent Office on Jul. 9, 2007, the entire contents of which are hereby incorporated by reference.

What is claimed is:

1. A method of manufacturing a semiconductor device, the method comprising steps of:
    attaching a plurality of first projections of a first bonding substrate to a base substrate;
    separating the first bonding substrate at the plurality of first projections to form a plurality of first semiconductor films over the base substrate;
    attaching a plurality of second projections of a second bonding substrate to the base substrate in regions different from regions where the plurality of first semiconductor films is formed; and
    separating the second bonding substrate at the plurality of second projections to form a plurality of second semiconductor films over the base substrate in the regions different from the regions where the plurality of first semiconductor films is formed.

2. A method according to claim 1, further comprising forming an insulating film over the base substrate,
    wherein the plurality of first projections is formed over the base substrate with the insulating film between the plurality of first projections and the base substrate, and
    wherein the plurality of second projections is formed over the base substrate with the insulating film between the plurality of second projections and the base substrate.

3. A method of manufacturing a semiconductor device, the method comprising steps of:
    forming a plurality of first projections on a first bonding substrate;
    forming a plurality of second projections on a second bonding substrate, wherein a width of each of the plurality of second projections in a direction perpendicular to the second bonding substrate is larger than a width of each of the plurality of first projections in the direction perpendicular to the first bonding substrate;
    attaching the plurality of first projections of the first bonding substrate to a base substrate;
    separating the first bonding substrate at the plurality of first projections to form a plurality of first semiconductor films over the base substrate;
    attaching the plurality of second projections of the second bonding substrate to the base substrate in regions different from regions where the plurality of first semiconductor films is formed; and
    separating the second bonding substrate at the plurality of second projections to form a plurality of second semiconductor films over the base substrate in the regions different from the regions where the plurality of first semiconductor films is formed.

4. A method according to claim 3, further comprising forming an insulating film over the base substrate,
wherein the plurality of first projections is formed over the base substrate with the insulating film between the plurality of first projections and the base substrate, and
wherein the plurality of second projections is formed over the base substrate with the insulating film between the plurality of second projections and the base substrate.

5. A method of manufacturing a semiconductor device, the method comprising steps of:
forming a first insulating film over a first bonding substrate,
forming a second insulating film over a second bonding substrate,
forming a plurality of first projections on the first bonding substrate by removing a part of the first insulating film and a part of the first bonding substrate;
forming a plurality of second projections on the second bonding substrate by removing a part of the second insulating film and a part of the second bonding substrate;
attaching the plurality of first projections of the first bonding substrate to a base substrate;
separating the first bonding substrate at the plurality of first projections to form a plurality of first semiconductor films over the base substrate;
attaching the plurality of second projections of the second bonding substrate to the base substrate in regions different from regions where the plurality of first semiconductor films is formed; and
separating the second bonding substrate at the plurality of second projections to form a plurality of second semiconductor films over the base substrate in the regions different from the regions where the plurality of first semiconductor films is formed.

6. A method according to claim 5, further comprising forming a third insulating film over the base substrate,
wherein the plurality of first projections is formed over the base substrate with the third insulating film between the plurality of first projections and the base substrate, and
wherein the plurality of second projections is formed over the base substrate with the third insulating film between the plurality of second projections and the base substrate.

7. A method according to claim 5,
wherein the first insulating film is a silicon oxide film formed by thermally oxidizing the first bonding substrate, and
wherein the second insulating film is a silicon oxide film formed by thermally oxidizing the second bonding substrate.

8. A method according to claim 5,
wherein each of the first insulating film and the second insulating film is a silicon oxide film formed by thermal CVD, plasma CVD, normal pressure CVD.

9. A method of manufacturing a semiconductor device, the method comprising steps of:
forming a first insulating film over a first bonding substrate;
forming a second insulating film over a second bonding substrate;
forming a first fragile layer in the first bonding substrate;
forming a second fragile layer in the second bonding substrate;
forming a plurality of first projections on the first bonding substrate by removing a part of the first insulating film and a part of the first bonding substrate;
forming a plurality of second projections on the second bonding substrate by removing a part of the second insulating film and a part of the second bonding substrate;
attaching the plurality of first projections of the first bonding substrate to a base substrate;
separating the first bonding substrate at the first fragile layer in the plurality of first projections to form a plurality of first semiconductor films over the base substrate;
attaching the plurality of second projections of the second bonding substrate to the base substrate in regions different from regions where the plurality of first semiconductor films is formed; and
separating the second bonding substrate at the second fragile layer in the plurality of second projections to form a plurality of second semiconductor films over the base substrate in the regions different from the regions where the plurality of first semiconductor films is formed.

10. A method according to claim 9, further comprising forming a third insulating film over the base substrate,
wherein the plurality of first projections is formed over the base substrate with the third insulating film between the plurality of first projections and the base substrate, and
wherein the plurality of second projections is formed over the base substrate with the third insulating film between the plurality of second projections and the base substrate.

11. A method according to claim 9,
wherein the first insulating film is a silicon oxide film formed by thermally oxidizing the first bonding substrate, and
wherein the second insulating film is a silicon oxide film formed by thermally oxidizing the second bonding substrate.

12. A method according to claim 9,
wherein each of the first insulating film and the second insulating film is a silicon oxide film formed by thermal CVD, plasma CVD, normal pressure CVD.

13. A method according to claim 9,
wherein the first fragile layer is formed by adding hydrogen ions to the first bonding substrate with use of an ion doping apparatus, and
wherein the second fragile layer is formed by adding hydrogen ions to the second bonding substrate with use of the ion doping apparatus.

14. A method according to claim 9,
wherein the first fragile layer is formed by adding rare gas ions to the first bonding substrate with use of an ion doping apparatus, and
wherein the second fragile layer is formed by adding rare gas ions to the second bonding substrate with use of the ion doping apparatus.

15. A method of manufacturing a semiconductor device, the method comprising steps of:
attaching a plurality of first projections of a first bonding substrate to a base substrate;
separating the first bonding substrate at the plurality of first projections to form a plurality of first semiconductor films over the base substrate;
attaching a plurality of second projections of a second bonding substrate to the base substrate in regions different from regions where the plurality of first semiconductor films is formed;
separating the second bonding substrate at the plurality of second projections to form a plurality of second semiconductor films over the base substrate in the regions different from the regions where the plurality of first semiconductor films is formed, and irradiating the plurality of first semiconductor films and the plurality of second semiconductor films with laser beam.

16. A method according to claim 15, further comprising forming an insulating film over the base substrate, wherein the plurality of first projections is formed over the base substrate with the insulating film between the plurality of first projections and the base substrate, and wherein the plurality of second projections is formed over the base substrate with the insulating film between the plurality of second projections and the base substrate.

* * * * *